(12) United States Patent
Gupta et al.

(10) Patent No.: US 11,587,954 B2
(45) Date of Patent: Feb. 21, 2023

(54) DISPLAYS WITH SILICON AND SEMICONDUCTING OXIDE THIN-FILM TRANSISTORS

(71) Applicant: Apple Inc., Cupertino, CA (US)

(72) Inventors: Vasudha Gupta, Cupertino, CA (US); Jae Won Choi, San Jose, CA (US); Shih Chang Chang, Cupertino, CA (US); Tsung-Ting Tsai, San Jose, CA (US); Young Bae Park, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/502,909

(22) Filed: Oct. 15, 2021

(65) Prior Publication Data
US 2022/0037374 A1   Feb. 3, 2022

Related U.S. Application Data

(63) Continuation of application No. 17/224,305, filed on Apr. 7, 2021, now Pat. No. 11,177,291, which is a
(Continued)

(51) Int. Cl.
*H01L 27/12*   (2006.01)
*G02F 1/1362*   (2006.01)
(Continued)

(52) U.S. Cl.
CPC ........ *H01L 27/1225* (2013.01); *G02F 1/1368* (2013.01); *G02F 1/13624* (2013.01);
(Continued)

(58) Field of Classification Search
CPC ............. H01L 27/1225; H01L 27/1222; H01L 27/1251; H01L 27/1255; H01L 27/3262;
(Continued)

(56) References Cited

U.S. PATENT DOCUMENTS 6,307,322 B1   10/2001   Dawson et al.
6,466,280 B1   10/2002   Park et al.
(Continued)

FOREIGN PATENT DOCUMENTS

CN   1521712 A   8/2004
CN   101063758   10/2007
(Continued)

OTHER PUBLICATIONS

Yueyue, "Principle and Application of Digital Televisoon Technology", Beijing Youdian Xueyuan Publishing House, Jun. 1, 2013, 27 pages.

*Primary Examiner* — Abbas I Abdulselam
(74) *Attorney, Agent, or Firm* — Treyz Law Group, P.C.; G. Victor Treyz; Joseph F. Guihan

(57) ABSTRACT

An electronic device may include a display having an array of display pixels on a substrate. The display pixels may be organic light-emitting diode display pixels or display pixels in a liquid crystal display. In an organic light-emitting diode display, hybrid thin-film transistor structures may be formed that include semiconducting oxide thin-film transistors, silicon thin-film transistors, and capacitor structures. The capacitor structures may overlap the semiconducting oxide thin-film transistors. Organic light-emitting diode display pixels may have combinations of oxide and silicon transistors. In a liquid crystal display, display driver circuitry may include silicon thin-film transistor circuitry and display pixels may be based on oxide thin-film transistors. A single layer or two different layers of gate metal may be used in forming silicon transistor gates and oxide transistor gates. A silicon transistor may have a gate that overlaps a floating gate structure.

14 Claims, 17 Drawing Sheets

Related U.S. Application Data continuation of application No. 16/917,601, filed on Jun. 30, 2020, now Pat. No. 10,998,344, which is a continuation of application No. 16/678,599, filed on Nov. 8, 2019, now Pat. No. 10,741,588, which is a continuation of application No. 16/125,973, filed on Sep. 10, 2018, now Pat. No. 10,707,237, which is a continuation of application No. 15/727,475, filed on Oct. 6, 2017, now Pat. No. 10,096,622, which is a continuation of application No. 14/249,716, filed on Apr. 10, 2014, now Pat. No. 9,818,765, which is a continuation-in-part of application No. 14/228,070, filed on Mar. 27, 2014, now Pat. No. 9,564,478.

(60) Provisional application No. 61/869,937, filed on Aug. 26, 2013.

(51) Int. Cl.
| | | |
|---|---|---|
| *G02F 1/1368* | (2006.01) | |
| *H01L 27/32* | (2006.01) | |
| *G02F 1/1345* | (2006.01) | |
| *H01L 29/786* | (2006.01) | |

(52) U.S. Cl.
CPC ...... *H01L 27/1222* (2013.01); *H01L 27/1251* (2013.01); *H01L 27/1255* (2013.01); *H01L 27/3262* (2013.01); *H01L 27/3272* (2013.01); *G02F 1/13452* (2013.01); *G02F 1/13454* (2013.01); *G02F 1/13685* (2021.01); *G02F 2202/104* (2013.01); *H01L 29/7869* (2013.01)

(58) Field of Classification Search
CPC ............. H01L 27/3272; G02F 1/13624; G02F 1/1368; G02F 1/13685; G02F 1/13452
See application file for complete search history.

(56) References Cited

U.S. PATENT DOCUMENTS

| | | | |
|---|---|---|---|
| 6,919,871 | B2 | 7/2005 | Kwon |
| 7,411,571 | B2 | 8/2008 | Huh |
| 7,737,631 | B2 | 6/2010 | Uhlig et al. |
| 8,067,775 | B2 | 11/2011 | Miyairi et al. |
| 8,264,426 | B2 | 9/2012 | Chung |
| 8,289,234 | B2 | 10/2012 | Kim |
| 8,421,090 | B2 | 4/2013 | Choi |
| 8,436,342 | B2 | 5/2013 | Park et al. |
| 8,455,869 | B2 | 6/2013 | Seo et al. |
| 8,530,290 | B2 | 9/2013 | Park et al. |
| 8,531,618 | B2 | 9/2013 | Koyama et al. |
| 8,581,257 | B2 | 11/2013 | Murai et al. |
| 8,890,220 | B2 | 11/2014 | Nathan et al. |
| 8,941,697 | B2 | 1/2015 | Nathan et al. |
| 8,993,126 | B2 | 3/2015 | Nowatari et al. |
| 9,129,927 | B2 | 9/2015 | Gupta et al. |
| 9,147,719 | B2 | 9/2015 | Kim et al. |
| 9,818,344 | B2 | 11/2017 | Lin et al. |
| 10,096,622 | B2 | 10/2018 | Gupta et al. |
| 10,741,588 | B2 | 8/2020 | Gupta et al. |
| 2001/0015778 | A1 | 8/2001 | Murade et al. |
| 2001/0043092 | A1 | 11/2001 | McDaniel |
| 2005/0007316 | A1 | 1/2005 | Akimoto et al. |
| 2005/0041002 | A1* | 2/2005 | Takahara ............. G09G 3/3258 345/76 |
| 2005/0253531 | A1 | 2/2005 | Kaneko et al. |
| 2005/0259494 | A1* | 11/2005 | Kimura ............... H01L 27/0629 365/222 |
| 2006/0208671 | A1 | 9/2006 | Ozaki et al. |
| 2007/0001205 | A1 | 1/2007 | Kimura |
| 2007/0040770 | A1 | 2/2007 | Kim |
| 2007/0236424 | A1 | 10/2007 | Kimura |
| 2008/0224961 | A1* | 9/2008 | Shin .................... H01L 27/3276 257/E27.113 |
| 2009/0002590 | A1 | 1/2009 | Kimura |
| 2009/0002731 | A1 | 1/2009 | Miyamoto et al. |
| 2009/0114918 | A1 | 5/2009 | Wang et al. |
| 2009/0160741 | A1 | 6/2009 | Inoue et al. |
| 2009/0244057 | A1 | 10/2009 | Seto |
| 2009/0251496 | A1 | 10/2009 | Saito et al. |
| 2010/0019996 | A1 | 1/2010 | Chun-Gi et al. |
| 2010/0102313 | A1 | 4/2010 | Miyairi et al. |
| 2010/0134735 | A1 | 6/2010 | Nakamura et al. |
| 2010/0182223 | A1 | 7/2010 | Choi et al. |
| 2010/0220117 | A1 | 9/2010 | Kimura |
| 2011/0031498 | A1 | 2/2011 | Kimura et al. |
| 2011/0049523 | A1 | 3/2011 | Choi et al. |
| 2011/0057865 | A1 | 3/2011 | Koyama |
| 2011/0199351 | A1 | 4/2011 | Kurokawa |
| 2011/0227505 | A1 | 9/2011 | Park et al. |
| 2011/0304311 | A1 | 12/2011 | Takahashi et al. |
| 2012/0001896 | A1 | 1/2012 | Han et al. |
| 2012/0026147 | A1 | 2/2012 | Komiya |
| 2012/0006253 | A1 | 3/2012 | Park |
| 2012/0061668 | A1 | 3/2012 | Miyairi et al. |
| 2012/0147060 | A1 | 6/2012 | Jeong |
| 2012/0228596 | A1 | 9/2012 | Fujita et al. |
| 2012/0299978 | A1 | 11/2012 | Chaji |
| 2012/0305910 | A1 | 12/2012 | Hsieh et al. |
| 2013/0001564 | A1 | 1/2013 | Choi et al. |
| 2013/0002616 | A1 | 1/2013 | Kim et al. |
| 2013/0015448 | A1 | 1/2013 | Yang et al. |
| 2013/0021549 | A1 | 1/2013 | Fujita |
| 2013/0109117 | A1 | 5/2013 | Lee et al. |
| 2013/0146866 | A1 | 6/2013 | Kitagawa et al. |
| 2013/0168666 | A1 | 7/2013 | Yan et al. |
| 2013/0020795 | A1 | 8/2013 | Lin et al. |
| 2013/0207957 | A1 | 8/2013 | Lin et al. |
| 2013/0214279 | A1 | 8/2013 | Nishimura et al. |
| 2013/0264570 | A1 | 10/2013 | Cho et al. |
| 2014/0049522 | A1 | 2/2014 | Mathew et al. |
| 2014/0138637 | A1 | 5/2014 | Yang et al. |
| 2014/0138651 | A1 | 5/2014 | Oh |
| 2014/0152685 | A1 | 6/2014 | Iwaki |
| 2014/0018466 | A1 | 7/2014 | Yoon et al. |
| 2014/0197382 | A1 | 7/2014 | Kim et al. |
| 2014/0346475 | A1 | 7/2014 | Cho et al. |
| 2014/0217373 | A1 | 8/2014 | Youn et al. |
| 2014/0217397 | A1 | 8/2014 | Kwak et al. |
| 2014/0231761 | A1 | 8/2014 | Kim et al. |
| 2014/0232956 | A1 | 8/2014 | Kwon et al. |
| 2014/0299884 | A1 | 10/2014 | Park et al. |
| 2014/0320544 | A1 | 10/2014 | Kim |
| 2015/0001483 | A1 | 1/2015 | Namkung |
| 2015/0054799 | A1 | 2/2015 | Chang et al. |
| 2015/0055047 | A1 | 2/2015 | Chang et al. |
| 2015/0007741 | A1 | 3/2015 | Miyake |
| 2015/0109279 | A1 | 4/2015 | Gupta et al. |
| 2015/0123557 | A1 | 5/2015 | Lee et al. |
| 2015/0213757 | A1 | 7/2015 | Takahama et al. |
| 2015/0243220 | A1 | 8/2015 | Kim et al. |
| 2015/0243686 | A1 | 8/2015 | Lee et al. |
| 2015/0243718 | A1 | 8/2015 | Kwon et al. |
| 2015/0243720 | A1 | 8/2015 | Kwon et al. |
| 2015/0248856 | A1 | 9/2015 | Kishi et al. |
| 2016/0087022 | A1 | 3/2016 | Tsai et al. |
| 2016/0171928 | A1 | 6/2016 | Gai et al. |
| 2017/0011005 | A1 | 4/2017 | Kuo |

FOREIGN PATENT DOCUMENTS

| | | |
|---|---|---|
| CN | 101354864 A | 1/2009 |
| CN | 101449311 A | 6/2009 |
| CN | 101958339 A | 1/2011 |
| CN | 102222468 A | 10/2011 |
| CN | 102237391 A | 11/2011 |
| CN | 102708798 A | 10/2012 |
| CN | 102854665 | 1/2013 |
| CN | 102930819 A | 2/2013 |
| CN | 103000632 A | 3/2013 |
| CN | 103839517 A | 6/2014 |
| CN | 104064149 A | 9/2014 |
| CN | 104332485 A | 2/2015 |

(56) References Cited

FOREIGN PATENT DOCUMENTS

| | | |
|---|---|---|
| CN | 204167325 U | 2/2015 |
| EP | 1640765 | 9/2005 |
| EP | 2743990 | 6/2014 |
| JP | 2000284722 | 10/2000 |
| JP | 2003173154 | 6/2003 |
| JP | 2003224461 A | 8/2003 |
| JP | 2003308030 A | 10/2003 |
| JP | 2005195756 A | 7/2005 |
| JP | 2006525539 A | 11/2006 |
| JP | 2007286150 | 11/2007 |
| JP | 2007298649 | 11/2007 |
| JP | 2008165028 | 7/2008 |
| JP | 2009025735 A | 2/2009 |
| JP | 2009-122253 | 6/2009 |
| JP | 2009157349 A | 7/2009 |
| JP | 210-3910 | 1/2010 |
| JP | 2010003910 | 1/2010 |
| JP | 2010056356 | 3/2010 |
| JP | 2010-224403 | 10/2010 |
| JP | 2010243645 A | 10/2010 |
| JP | 2010256914 | 11/2010 |
| JP | 2011048339 | 3/2011 |
| JP | 2011054936 | 3/2011 |
| JP | 2011054951 | 3/2011 |
| JP | 2011076078 | 4/2011 |
| JP | 2011107685 A | 6/2011 |
| JP | 2011141529 | 7/2011 |
| JP | 2011209405 | 10/2011 |
| JP | 2012063734 A | 3/2012 |
| JP | 2012093707 | 5/2012 |
| JP | 2012098316 A | 5/2012 |
| JP | 2012186083 | 9/2012 |
| JP | 2012-255840 | 12/2012 |
| JP | 2012256012 A | 12/2012 |
| JP | 2013047802 | 3/2013 |
| JP | 2013051423 | 3/2013 |
| JP | 2014106539 | 6/2014 |
| JP | 2015079241 A | 4/2015 |
| JP | 2015111703 | 6/2015 |
| JP | 2015156486 | 8/2015 |
| JP | 2015225104 | 12/2015 |
| KR | 10-2007-0078470 | 8/2007 |
| KR | 10-2009-0085231 | 8/2009 |
| KR | 10-2010-0031342 | 3/2010 |
| KR | 10-2010-0083322 | 7/2010 |
| KR | 10-2010-0086256 | 7/2010 |
| KR | 10-2011-0015380 | 2/2011 |
| KR | 10-2011-0132814 | 12/2011 |
| KR | 10-20110133281 A | 12/2011 |
| KR | 10-2008-0002237 | 4/2013 |
| KR | 10-20130074147 A | 7/2013 |
| TW | 200305131 A | 10/2003 |
| TW | 201251026 A | 12/2012 |
| WO | 2011125353 | 10/2011 |
| WO | 2012046658 | 4/2012 |
| WO | 2012/176422 | 12/2012 |
| WO | 2012164475 A2 | 12/2012 |
| WO | 2012176422 | 12/2012 |

\* cited by examiner

DISPLAYS WITH SILICON AND SEMICONDUCTING OXIDE THIN-FILM TRANSISTORS This application is a continuation of patent application Ser. No. 17/224,305, filed Apr. 7, 2021, which is hereby incorporated by reference herein in its entirety and which is a continuation of patent application No. 16/917,601, filed Jun. 30, 2020, now U.S. Pat. No. 10,998,344, which is hereby incorporated by reference herein in its entirety and which is a continuation of patent application Ser. No. 16/678,599, filed Nov. 8, 2019, now U.S. Pat. No. 10,741,588, which is hereby incorporated by reference herein in its entirety and which is continuation of patent application Ser. No. 16/125,973, filed Sep. 10, 2018, now U.S. Pat. No. 10,707,237, which is hereby incorporated by reference herein in its entirety and which is continuation of patent application Ser. No. 15/727,475, filed Oct. 6, 2017, now U.S. Pat. No. 10,096,622, which is hereby incorporated by reference herein in its entirety and which is a continuation of patent application Ser. No. 14/249,716, filed Apr. 10, 2014, now U.S. Pat. No. 9,818,765, which is hereby incorporated by reference herein in its entirety and which is a continuation-in-part of patent application Ser. No. 14/228,070, filed Mar. 27, 2014, now U.S. Pat. No. 9,564,478, which is hereby incorporated by reference herein in its entirety and which claims the benefit of U.S. provisional patent application No. 61/869,937, filed Aug. 26, 2013, which is hereby incorporated by reference herein in its entirety.

BACKGROUND

This relates generally to electronic devices and, more particularly, to electronic devices with displays that have thin-film transistors.

Electronic devices often include displays. For example, cellular telephones and portable computers include displays for presenting information to users.

Displays such as liquid crystal displays are formed from multiple layers. A liquid crystal display may, for example, have upper and lower polarizer layers, a color filter layer that contains an array of color filter elements, a thin-film transistor layer that includes thin-film transistors and display pixel electrodes, and a layer of liquid crystal material interposed between the color filter layer and the thin-film transistor layer. Each display pixel typically includes a thin-film transistor for controlling application of a signal to display pixel electrode structures in the display pixel.

Displays such as organic light-emitting diode displays have an array of display pixels based on light-emitting diodes. In this type of display, each display pixel includes a light-emitting diode and thin-film transistors for controlling application of a signal to the light-emitting diode.

Thin-film display driver circuitry is often included in displays. For example, gate driver circuitry and demultiplexer circuitry on a display may be formed from thin-film transistors.

If care is not taken, thin-film transistor circuitry in the display pixels and display driver circuitry of a display may exhibit non-uniformity, excessive leakage currents, insufficient drive strengths, poor area efficiency, hysteresis, and other issues. It would therefore be desirable to be able to provide improved electronic device displays.

SUMMARY

An electronic device may be provided with a display. The display may have an array of display pixels on a substrate. The display pixels may be organic light-emitting diode display pixels or display pixels in a liquid crystal display.

In an organic light-emitting diode display, hybrid thin-film transistor structures may be formed that include semiconducting oxide thin-film transistors, silicon thin-film transistors, and capacitor structures. The capacitor structures may overlap the semiconducting oxide thin-film transistors. Capacitor structures may also be formed from multiple overlapping electrode layers formed from source-drain metal layers, a polysilicon layer, and a gate metal layer may be used.

Organic light-emitting diode display pixels may have combinations of oxide and silicon transistors. Transistors such as drive transistors that are coupled to light-emitting diodes may be formed from oxide transistor structures and switching transistors may be formed from silicon transistor structures.

In a liquid crystal display, display driver circuitry may include silicon thin-film transistor circuitry and display pixels may be based on oxide thin-film transistors. A single layer or two different layers of gate metal may be used in forming silicon transistor gates and oxide transistor gates. A silicon transistor may have a gate that overlaps a floating gate structure. Oxide transistors may be incorporated into display driver circuitry.

Display driver circuitry may be configured to expose silicon transistor circuitry to lower voltage swings than oxide transistor circuitry in an array of display pixels.

DETAILED DESCRIPTION

Figure 1:
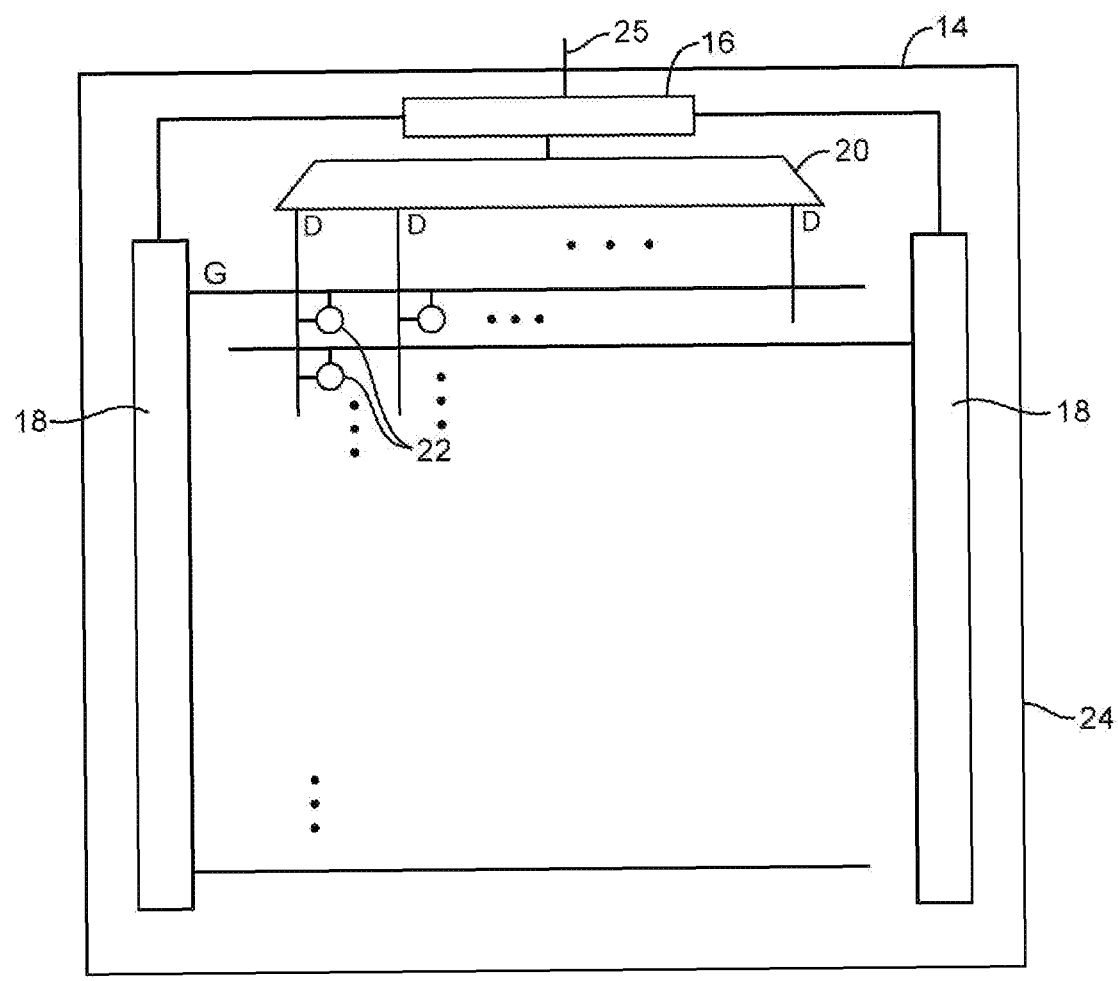
FIG. 1 is a diagram of an illustrative display such as an organic light-emitting diode display having an array of organic light-emitting diode display pixels or a liquid crystal display having an array of display pixels in accordance with an embodiment.

A display in an electronic device may be provided with driver circuitry for displaying images on an array of display pixels. An illustrative display is shown in FIG. 1. As shown in FIG. 1, display 14 may have one or more layers such as substrate 24. Layers such as substrate 24 may be formed from planar rectangular layers of material such as planar glass layers. Display 14 may have an array of display pixels 22 for displaying images for a user. The array of display pixels 22 may be formed from rows and columns of display pixel structures on substrate 24. There may be any suitable number of rows and columns in the array of display pixels 22 (e.g., ten or more, one hundred or more, or one thousand or more).

Display driver circuitry such as display driver integrated circuit 16 may be coupled to conductive paths such as metal traces on substrate 24 using solder or conductive adhesive. Display driver integrated circuit 16 (sometimes referred to as a timing controller chip) may contain communications circuitry for communicating with system control circuitry over path 25. Path 25 may be formed from traces on a flexible printed circuit or other cable. The control circuitry may be located on a main logic board in an electronic device such as a cellular telephone, computer, set-top box, media player, portable electronic device, or other electronic equipment in which display 14 is being used. During operation, the control circuitry may supply display driver integrated circuit 16 with information on images to be displayed on display 14. To display the images on display pixels 22, display driver integrated circuit 16 may supply corresponding image data to data lines D while issuing clock signals and other control signals to supporting thin-film transistor display driver circuitry such as gate driver circuitry 18 and demultiplexing circuitry 20.

Gate driver circuitry 18 may be formed on substrate 24 (e.g., on the left and right edges of display 14, on only a single edge of display 14, or elsewhere in display 14). Demultiplexer circuitry 20 may be used to demultiplex data signals from display driver integrated circuit 16 onto a plurality of corresponding data lines D. With this illustrative arrangement of FIG. 1, data lines D run vertically through display 14. Each data line D is associated with a respective column of display pixels 22. Gate lines G run horizontally through display 14. Each gate line G is associated with a respective row of display pixels 22. Gate driver circuitry 18 may be located on the left side of display 14, on the right side of display 14, or on both the right and left sides of display 14, as shown in FIG. 1.

Gate driver circuitry 18 may assert gate signals (sometimes referred to as scan signals) on the gate lines G in display 14. For example, gate driver circuitry 18 may receive clock signals and other control signals from display driver integrated circuit 16 and may, in response to the received signals, assert a gate signal on gate lines G in sequence, starting with the gate line signal G in the first row of display pixels 22. As each gate line is asserted, the corresponding display pixels in the row in which the gate line is asserted will display the display data appearing on the data lines D.

Display driver circuitry such as demultiplexer circuitry 20 and gate line driver circuitry 18 may be formed from thin-film transistors on substrate 24. Thin-film transistors may also be used in forming circuitry in display pixels 22. To enhance display performance, thin-film transistor structures in display 14 may be used that satisfy desired criteria such as leakage current, switching speed, drive strength, uniformity, etc. The thin-film transistors in display 14 may, in general, be formed using any suitable type of thin-film transistor technology (e.g., silicon-based, semiconducting-oxide-based, etc.).

With one suitable arrangement, which is sometimes described herein as an example, the channel region (active region) in some thin-film transistors on display 14 is formed from silicon (e.g., silicon such as polysilicon deposited using a low temperature process, sometimes referred to as LTPS or low-temperature polysilicon) and the channel region in other thin-film transistors on display 14 is formed from a semiconducting oxide material (e.g., amorphous indium gallium zinc oxide, sometimes referred to as IGZO). If desired, other types of semiconductors may be used in forming the thin-film transistors such as amorphous silicon, semiconducting oxides other than IGZO, etc. In a hybrid display configuration of this type, silicon transistors (e.g., LTPS transistors) may be used where attributes such as switching speed and good drive current are desired (e.g., for gate drivers in liquid crystal diode displays or in portions of an organic light-emitting diode display pixel where switching speed is a consideration), whereas oxide transistors (e.g., IGZO transistors) may be used where low leakage current is desired (e.g., in liquid crystal diode display pixels and display driver circuitry) or where high pixel-to-pixel uniformity is desired (e.g., in an array of organic light-emitting diode display pixels). Other considerations may also be taken into account (e.g., considerations related to power consumption, real estate consumption, hysteresis, etc.).

Oxide transistors such as IGZO thin-film transistors are generally n-channel devices (i.e., NMOS transistors). Silicon transistors can be fabricated using p-channel or n-channel designs (i.e., LTPS devices may be either PMOS or NMOS). Combinations of these thin-film transistor structures can provide optimum performance.

Figure 2:
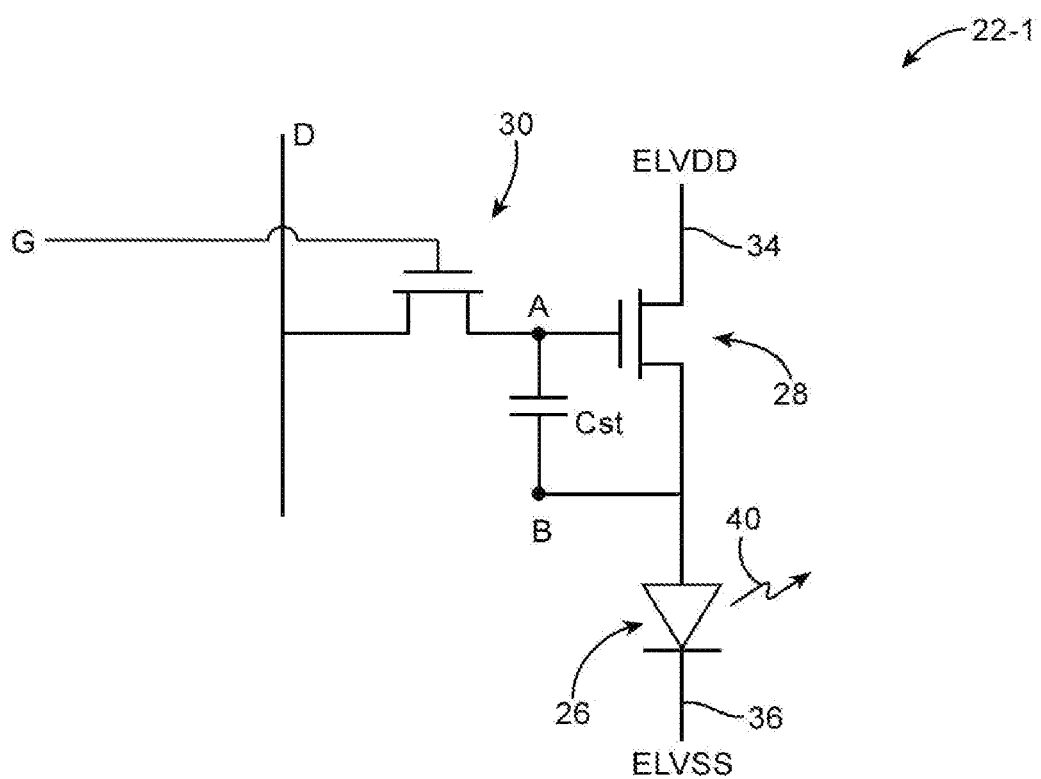
FIG. 2 is a diagram of an illustrative organic light-emitting diode display pixel of the type that may be used in an organic light-emitting diode with semiconducting oxide thin-film transistors and silicon thin-film transistors in accordance with an embodiment.

In an organic light-emitting diode display, each display pixel contains a respective organic light-emitting diode. A schematic diagram of an illustrative organic light-emitting diode display pixel 22-1 is shown in FIG. 2. As shown in FIG. 2, display pixel 22-1 may include light-emitting diode 26. A positive power supply voltage ELVDD may be supplied to positive power supply terminal 34 and a ground power supply voltage ELVSS may be supplied to ground power supply terminal 36. The state of drive transistor 28 controls the amount of current flowing through diode 26 and therefore the amount of emitted light 40 from display pixel 22-1.

To ensure that transistor 28 is held in a desired state between successive frames of data, display pixel 22-1 may include a storage capacitor such as storage capacitor Cst. The voltage on storage capacitor Cst is applied to the gate of transistor 28 at node A to control transistor 28. Data can be loaded into storage capacitor Cst using one or more switching transistors such as switching transistor 30. When switching transistor 30 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22-1 is asserted, switching transistor 30 will be turned on and a new data signal on data line D will be loaded into storage capacitor Cst. The new signal on capacitor Cst is applied to the gate of transistor 28 at node A, thereby adjusting the state of transistor 28 and adjusting the corresponding amount of light 40 that is emitted by light-emitting diode 26.

Figure 3:
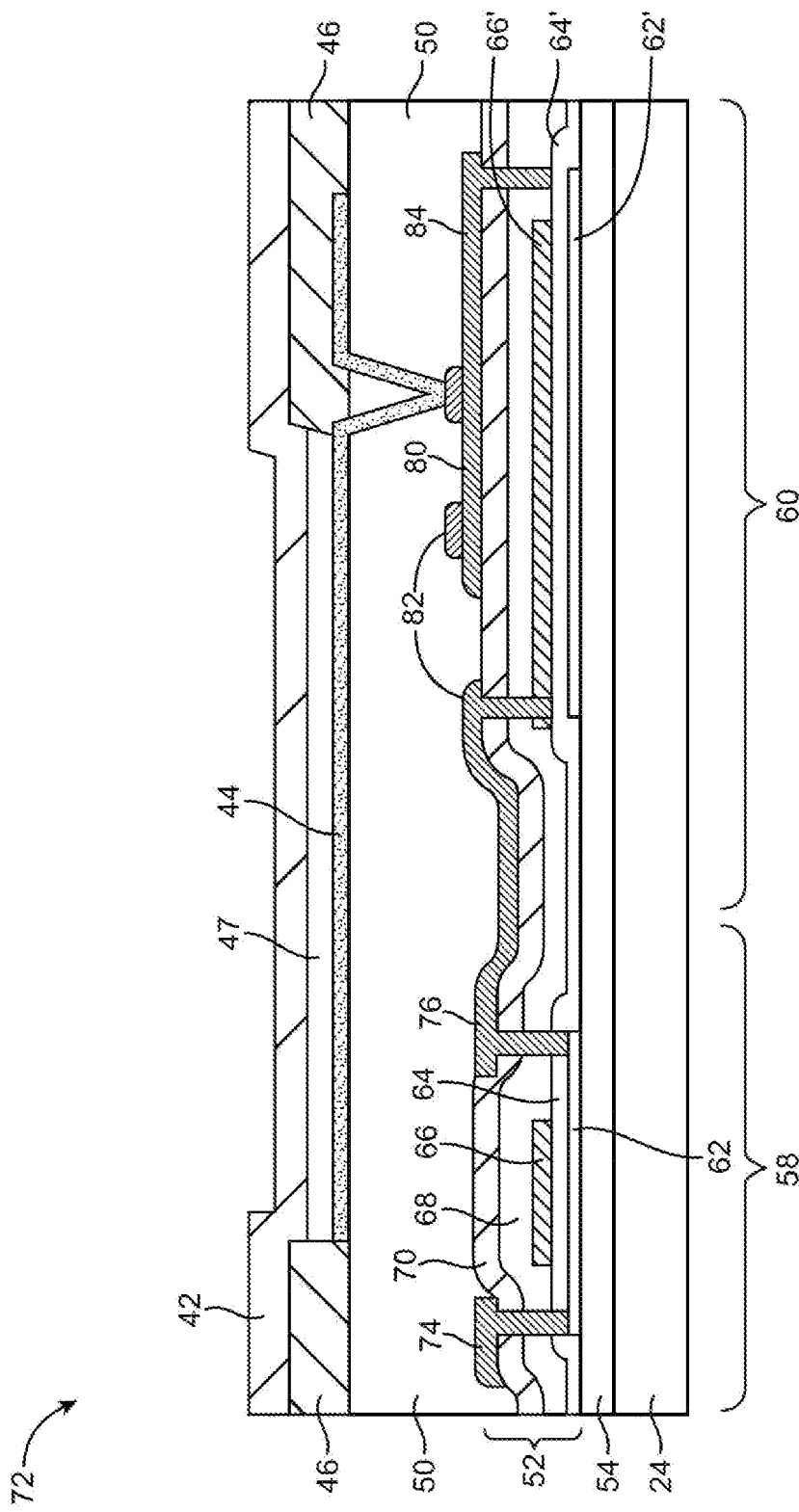
FIG. 3 is a cross-sectional side view of illustrative thin-film transistor structures in accordance with an embodiment.

Organic light-emitting diode display pixels such as pixel 22-1 of FIG. 2 may use thin-film transistor structures of the type shown in FIG. 3. In this type of structure, two different types of semiconductor are used. As shown in FIG. 3, circuitry 72 may include display pixel structures such as light-emitting diode cathode terminal 42 and light-emitting diode anode terminal 44. Organic light-emitting diode emissive material 47 may be interposed between cathode 42 and anode 44. Dielectric layer 46 may serve to define the layout of the display pixel and may sometimes be referred to as a pixel definition layer. Planarization layer 50 may be formed on top of thin-film transistor structures 52. Thin-film transistor structures 52 may be formed on buffer layer 54 on substrate 24.

Thin-film transistor structures 52 may include silicon transistor 58. Transistor 58 may be an LTPS transistor formed using a "top gate" design and may serve as a switching transistor in an organic light-emitting diode display pixel (see, e.g., transistor 30 in pixel 22-1 of FIG. 2). Transistor 58 may have a polysilicon channel 62 that is covered by gate insulator layer 64 (e.g., a layer of silicon oxide). Gate 66 may be formed from patterned metal (e.g., molybdenum, as an example). Gate 66 may be covered by a layer of interlayer dielectric (e.g., silicon nitride layer 68 and silicon oxide layer 70). Source-drain contacts 74 and 76 may contact opposing sides of polysilicon layer 62 to form the silicon thin-film transistor 58.

Thin-film transistor structures 52 may also include thin-film transistor and capacitor structures 60. Structures 60 may include a storage capacitor (i.e., storage capacitor Cst of FIG. 2) and an oxide thin-film transistor structure. The storage capacitor may have a first terminal (sometimes referred to as a plate, electrode, or electrode layer) that is formed from polysilicon layer 62' (patterned as part of the same layer as layer 62). Gate insulator layer 64', which may be an extended portion of gate insulator layer 64, may cover terminal 62'. The capacitor may have a second terminal formed from metal layer 66'. Metal layer 66' may be patterned from the same metal layer that is used in forming gate 66 of transistor 58. Dielectric layers 68 and 70 may cover metal layer 66'. The thin-film transistor in structures 60 may be a "bottom gate" oxide transistor. Layer 66', which serves as the second terminal of capacitor Cst (i.e., node A of FIG. 2) may also serve as the gate of the oxide transistor. The oxide transistor may serve as drive transistor 28 of FIG. 2. The "gate insulator" of the oxide transistor may be formed from the layer of interlayer dielectric (i.e., layers 68 and 70). The channel semiconductor of the oxide transistor may be formed from oxide layer 80 (e.g., IGZO). Oxide layer 80 may overlap polysilicon capacitor electrode layer 62' (i.e., the oxide transistor may overlap the capacitor), thereby saving space. Source-drain terminals 82 and 84 may be formed from metal contacting opposing ends of semiconducting oxide layer 80.

Transistors such as LTPS transistors and oxide transistors may be formed with different layouts. For example, LTPS transistors tend to have high carrier mobilities. As a result, LTPS transistors may have relatively long gate lengths L and relatively short gate widths to ensure appropriately low ratios of W/L to compensate for the relatively high mobility of these transistors. This may cause LTPS transistors to be relatively inefficient for pixel layout. Oxide transistors may be constructed with W/L ratios with smaller aspect ratios (e.g., 4/4 for oxide relative to 3/30 for LTPS). Due to these layout efficiency considerations, it may be preferred to use oxide transistors as the drive transistors in display pixels 22-1. The relatively fast switching speed provided by LTPS transistor may make it preferable to use LTPS transistors for switching transistors such as transistor 30 of FIG. 2.

In display pixels with more transistors (e.g., three or more, four or more, five or more, six or more, seven or more, or eight or more), the selection of which transistors are implemented using LTPS technology and which transistors are implemented using oxide technology may be made so as to balance transistor performance considerations between the two types of transistors.

When implementing driving transistors, LTPS transistors tend to exhibit larger size (longer channel length) than oxide transistors, tend to exhibit larger dark currents than oxide transistors, and may exhibit poorer uniformity than oxide transistors. LTPS driving transistors may also exhibit more hysteresis than oxide driving transistors. As a result of these factors, it may often be advantageous to form driving transistors in an organic light-emitting diode display pixel from oxide transistors. The oxide driving transistors may exhibit low leakage current and minimal hysteresis.

When implementing switching transistors, LTPS transistors may be smaller than oxide transistors, may exhibit smaller amounts of parasitic capacitance than oxide transistors, and may exhibit lower power consumption than oxide transistors. As a result of factors such as these, it may often be advantageous to form switching transistors in an organic light-emitting diode display pixel from LTPS transistors. The LTPS switching transistors may exhibit high switching speed and low parasitic capacitance.

Figure 4:
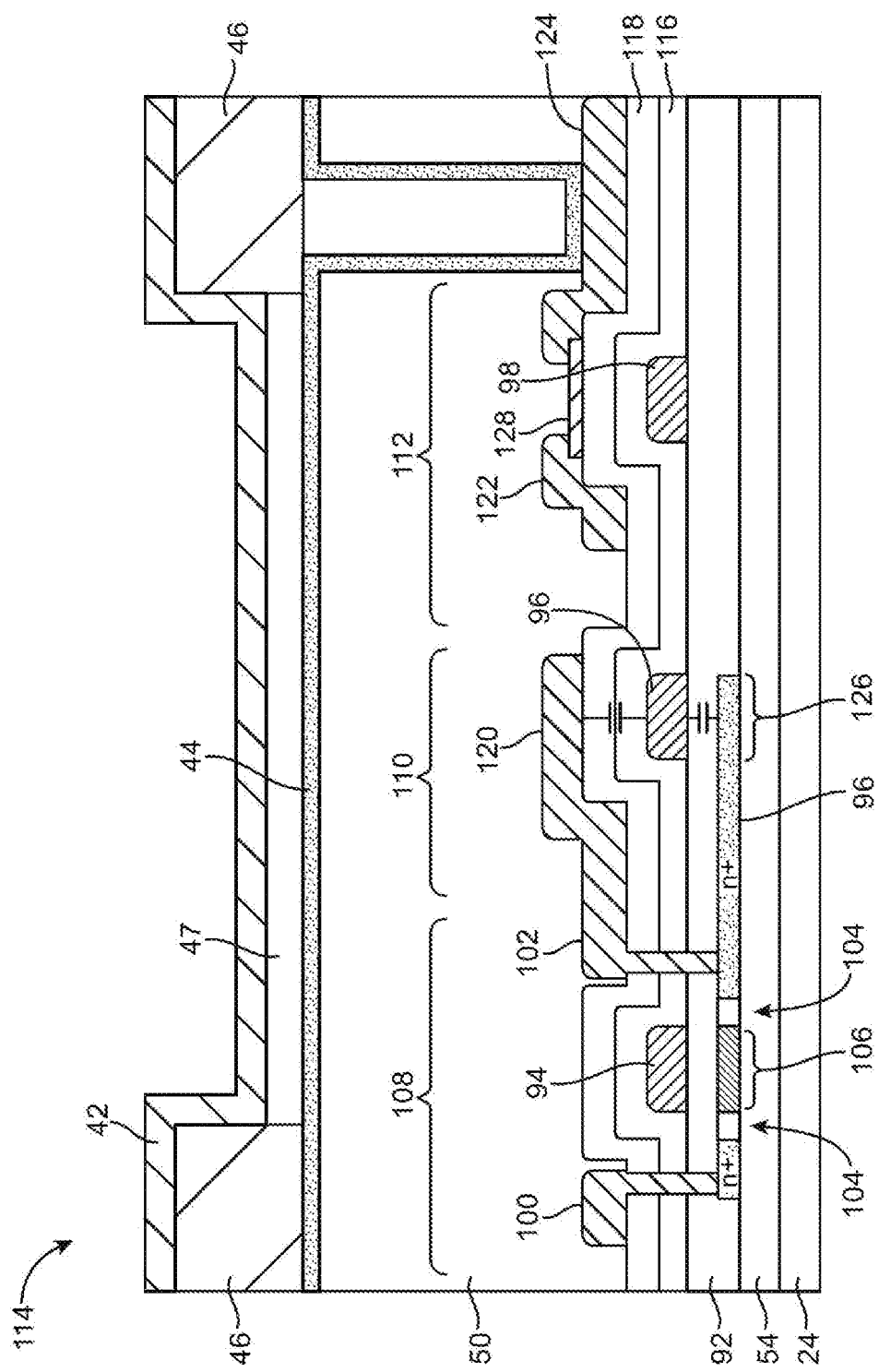
FIG. 4 is a side view of additional illustrative thin-film transistor structures in accordance with an embodiment.

An illustrative hybrid thin-film transistor structure that may be used in implementing both LTPS and oxide transistors in a single organic light-emitting diode display pixel (e.g., to implement a circuit such as display pixel circuit 22-1 of FIG. 2) is shown in FIG. 4. Hybrid thin-film transistor structures 114 of FIG. 4 include silicon thin-film transistor 108, capacitor (Cst) 110, and oxide transistor 112. Silicon transistor 108 is formed from polysilicon layer 90. Gate insulator layer 92 covers polysilicon layer 90. A layer of gate metal is patterned on top of gate insulator layer 92 to form gate 94, capacitor electrode 96, and gate electrode 98. A layer of interlayer dielectric material such as silicon nitride layer 116 and silicon oxide layer 118 may cover the patterned gate metal structures. Source-drain contacts 100 and 94 for silicon transistor 108 may contact (i.e., may be shorted to) polysilicon layer 90 in the vicinity of channel region 106. Gate 94 of transistor 108 may serve as an implant mask to allow low-density drain implants to be formed in polysilicon layer 90 in regions 104 adjacent to polysilicon channel region 106 of transistor 108.

Source-drains 100 and 102 of silicon transistor 108, capacitor electrode 120, and source-drains 122 and 124 of oxide transistor 112 may be formed from patterned portions of a common metal layer on interlayer dielectric 116 and 118.

Capacitor 110 may have a first terminal formed from metal electrode 120 and from portion 126 of polysilicon layer 90. Capacitor 110 may have a second terminal formed from metal electrode 96.

Oxide transistor 112 may have a semiconductor oxide layer such as an IGZO layer 128, source-drain contacts 122 and 124, and gate 98. Gate 98 is separated from semiconductor oxide 128, which serves as the channel region for transistor 112 by dielectric 116 and 118. Dielectric 116 and 118 therefore serves as the gate insulator for oxide transistor 112.

Figure 5:
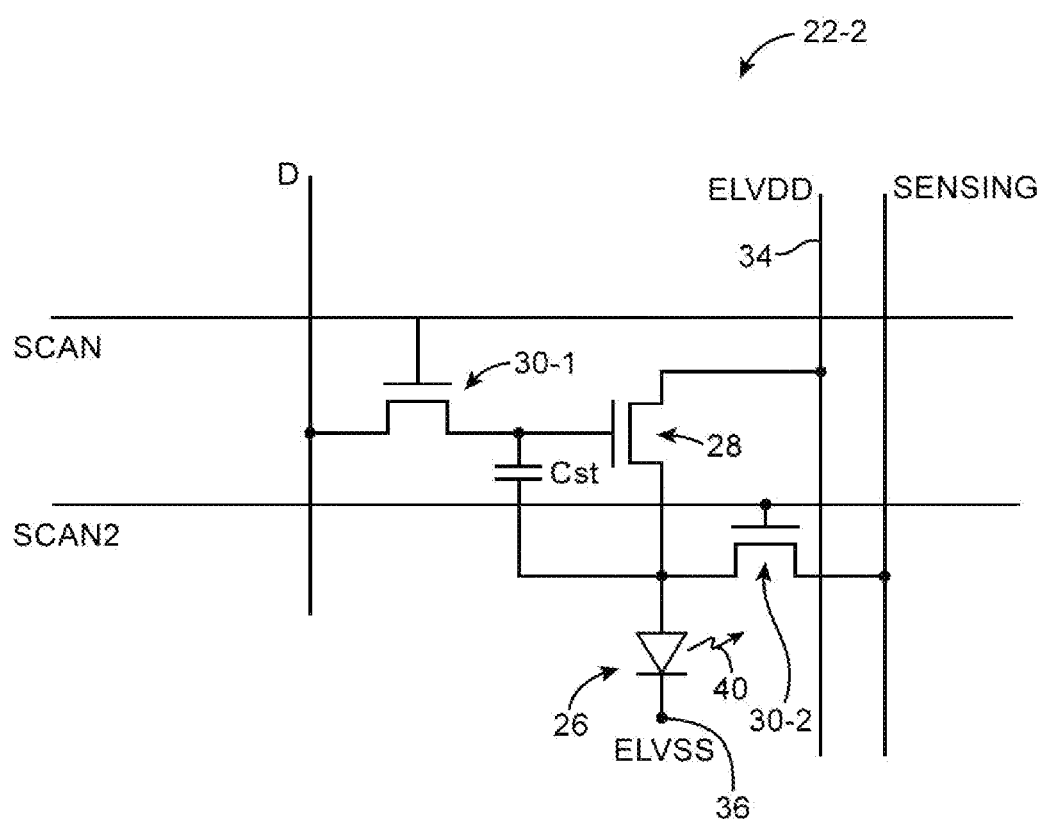
FIG. 5 is a diagram of an illustrative organic light-emitting diode display pixel of the type that may include oxide and silicon thin-film transistors in accordance with an embodiment.

FIG. 5 is a circuit diagram of another illustrative organic light-emitting diode pixel circuit that may be used in display 14. Pixel 22-2 includes driver transistor 28 for driving current into light-emitting diode 26. Storage capacitor Cst is used to store signals on the gate of transistor 28 between frames. Sensing line SENSING used to implement a compensation scheme to adjust for pixel-to-pixel variations in transistor performance. Gate lines SCAN and SCAN2 are used in applying control signals to switching transistors 30-1 and 30-2.

To optimize performance in display pixel 22-2, it may be desirable to use hybrid structures of the type shown in FIGS. 3 and 4 or other configurations for forming silicon and/or oxide thin-film transistors and capacitors. For example, it may be desirable to form drive transistor 28 from an oxide transistor (e.g., an NMOS oxide transistor), while forming switching transistors such as transistors 30-1 and 30-2 from silicon transistors or from a mixture of silicon (NMOS and/or PMOS) and oxide (NMOS) transistors.

With a first illustrative configuration, transistor 30-1 is an oxide transistor, transistor 30-2 is an oxide transistor, and transistor 28 is an oxide transistor. With a second illustrative configuration, transistor 30-1 is a silicon transistor, transistor 30-2 is a silicon transistor, and transistor 28 is an oxide transistor. A hybrid transistor structure such as the structure of FIG. 3 or the structure of FIG. 4 may be used in this scenario (e.g., to implement transistors 30-1 and 28 and capacitor Cst). With an illustrative third configuration, transistor 30-1 is a silicon transistor, transistor 30-2 is an oxide transistor, and transistor 28 is an oxide transistor. As with the second illustrative configuration, a hybrid transistor structure such as the structure of FIG. 3 or the structure of FIG. 4 may be used to implement transistors 30-1 and 28 and capacitor Cst.

If desired, display 14 may be a liquid crystal display. In this type of scenario, each pixel of display 14 may contain an electrode structure for applying an electric field to an associated portion of a liquid crystal layer in the display, a capacitor for storing charge on the electrode between frames of image data, and a thin-film transistor for controlling the application of the electric field to the electrodes. With one suitable arrangement, gate driver circuitry 18 and demultiplexer circuitry 20 (FIG. 1) in the liquid crystal display may be formed from silicon transistors and the thin-film transistors in display pixels 22 may be formed from oxide transistors. The silicon transistors have high mobility channel regions and are well suited for fast switching speeds and high drive currents while operating at low voltages and low power. The oxide thin-film transistors in display pixels 22 exhibit low leakage currents.

Figure 6:
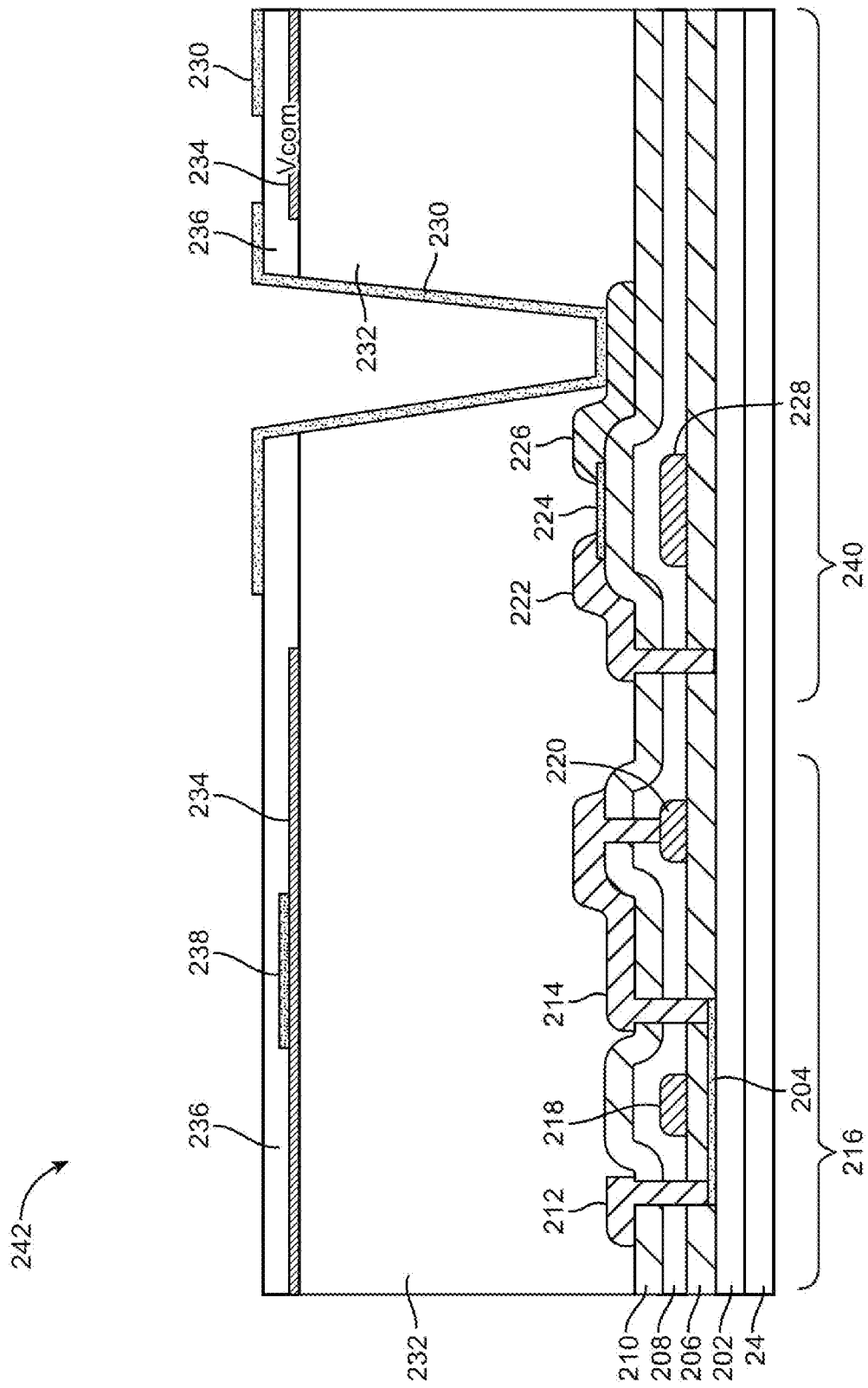
FIGS. 6, 7, and 8 are cross-sectional side views of illustrative thin-film transistor circuitry in a liquid crystal display in accordance with an embodiment.

Thin-film transistor structures of the type that may be used in forming a liquid crystal display with both silicon and oxide transistors are shown in FIG. 6. As shown in FIG. 6, thin-film transistor structures 242 may include silicon thin-film transistor structures 216 (e.g., for forming parts of peripheral circuits such as display driver circuitry 18 and demultiplexer circuitry 20) and oxide thin-film transistor structures 240 (e.g., for forming display pixels 22 in a liquid crystal display having a layout of the type shown by display 14 of FIG. 1).

Structures 216 and 240 may be formed on buffer layer 202 on substrate 24. Polysilicon layer 204 may be deposited on buffer 202. Gate insulator layer 206 may be formed on polysilicon layer 204. A common layer of metal may be patterned to form metal structures 218, 220, and 228. Structure 218 may serve as the gate for a silicon transistor that includes source-drain contacts 212 and 214 and a channel formed from polysilicon 204. Metal structure 228 may serve as a gate for an oxide transistor formed from semiconducting oxide layer 224 (e.g., IGZO) and source-drain terminals 222 and 226. Metal structure 228 may also serve as a light shield that helps block backlight in display 14 from reaching oxide layer 224, so no separate light shielding structures need be incorporated in structures 240. Interlayer dielectric such as silicon nitride layer 208 and 210 may cover gate 218 in structure 216 and may serve as a gate insulator for gate 228 in the oxide transistor of structures 240.

Metal 230 contacts source-drain 226 of the display pixel thin-film oxide transistor that is formed from oxide layer 224. Metal 230 may be supported by organic layer 232. On the surface of organic layer 232, metal 230 may form an electrode with multiple fingers. Dielectric layer 236 may isolate electrode 230 from common electrode (Vcom) 234. During operation, electric fields are produced between electrode 230 and electrode 234. These fields pass through the liquid crystal material in the display. If desired, display 14 may incorporate capacitive touch sensors that are formed from portions of Vcom electrode 234. In this type of configuration, optional metal lines such as line 238 may be used to help reduce the resistance of the material used in forming electrode 234 (which may be, for example, a somewhat resistive conducting material such as indium tin oxide).

Figure 7:
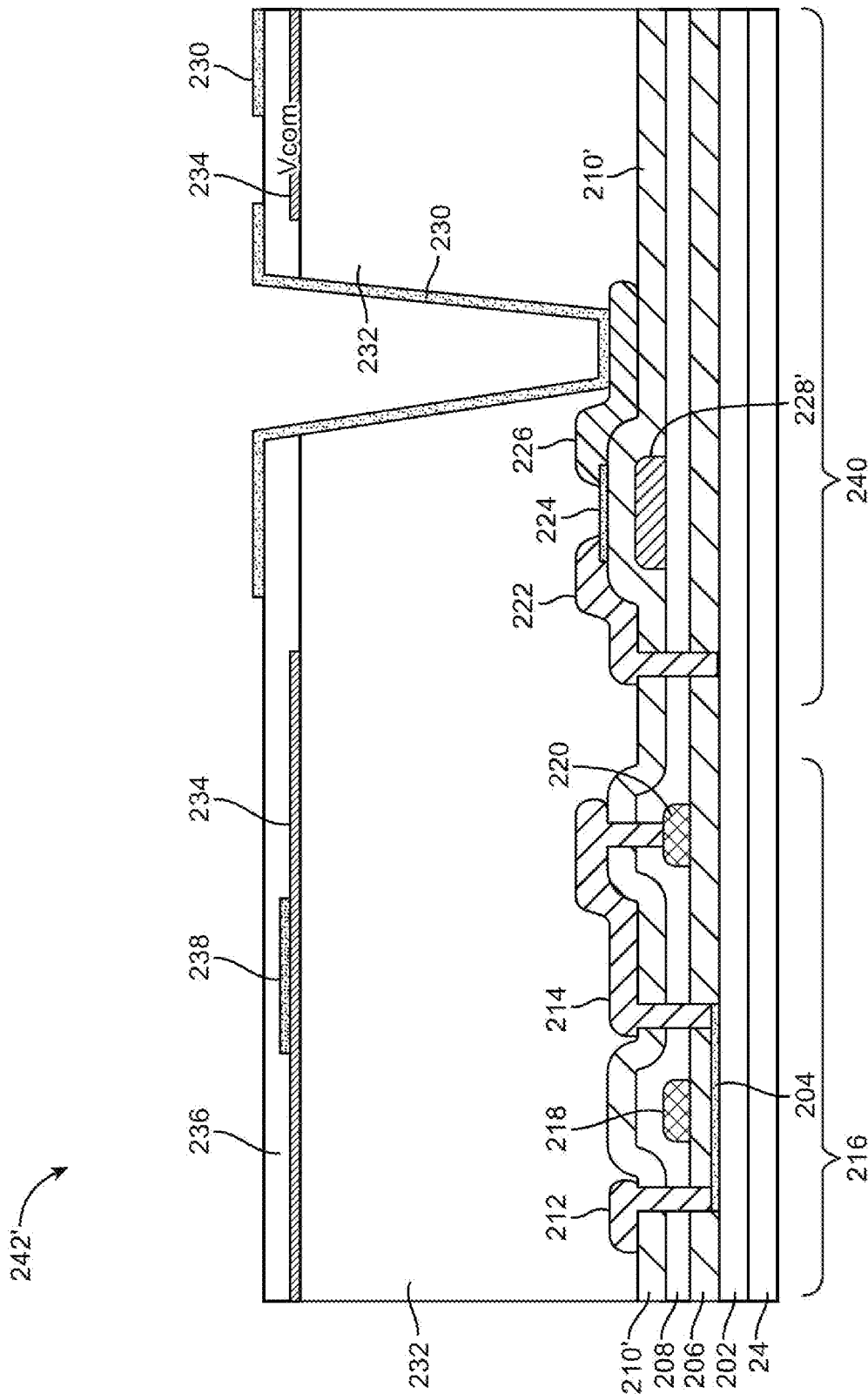

The thickness of layers 208 and 210 may be about 6000 angstroms. This relatively large thickness may help minimize capacitance between gate 218 and nearby metal structures such as source-drain 214, but may limit switching speeds in the oxide transistor. To address this concern, a design of the type used by structures 242' in FIG. 7 may be used. With the FIG. 7 arrangement, an additional semiconductor fabrication mask may be used to create a gate for the oxide transistor that is formed from a separate layer of metal from the metal layer used in forming gate 218. With this approach, only a single 3000 angstrom dielectric layer 210' (formed, e.g., from sublayers of silicon nitride and silicon oxide) is used to separate oxide transistor gate 228' from oxide layer 224, so oxide transistor switching speed may be enhanced. The arrangement of structures 242' of FIG. 7 allows gate 218 and gate 228' to be formed from different metals. For example, gate 218 may be formed from a refractory metal such as Mo to accommodate the elevated temperatures associated with activating the silicon transistor, whereas gate 228' may be formed from a lower resistance metal such as copper.

Figure 8:
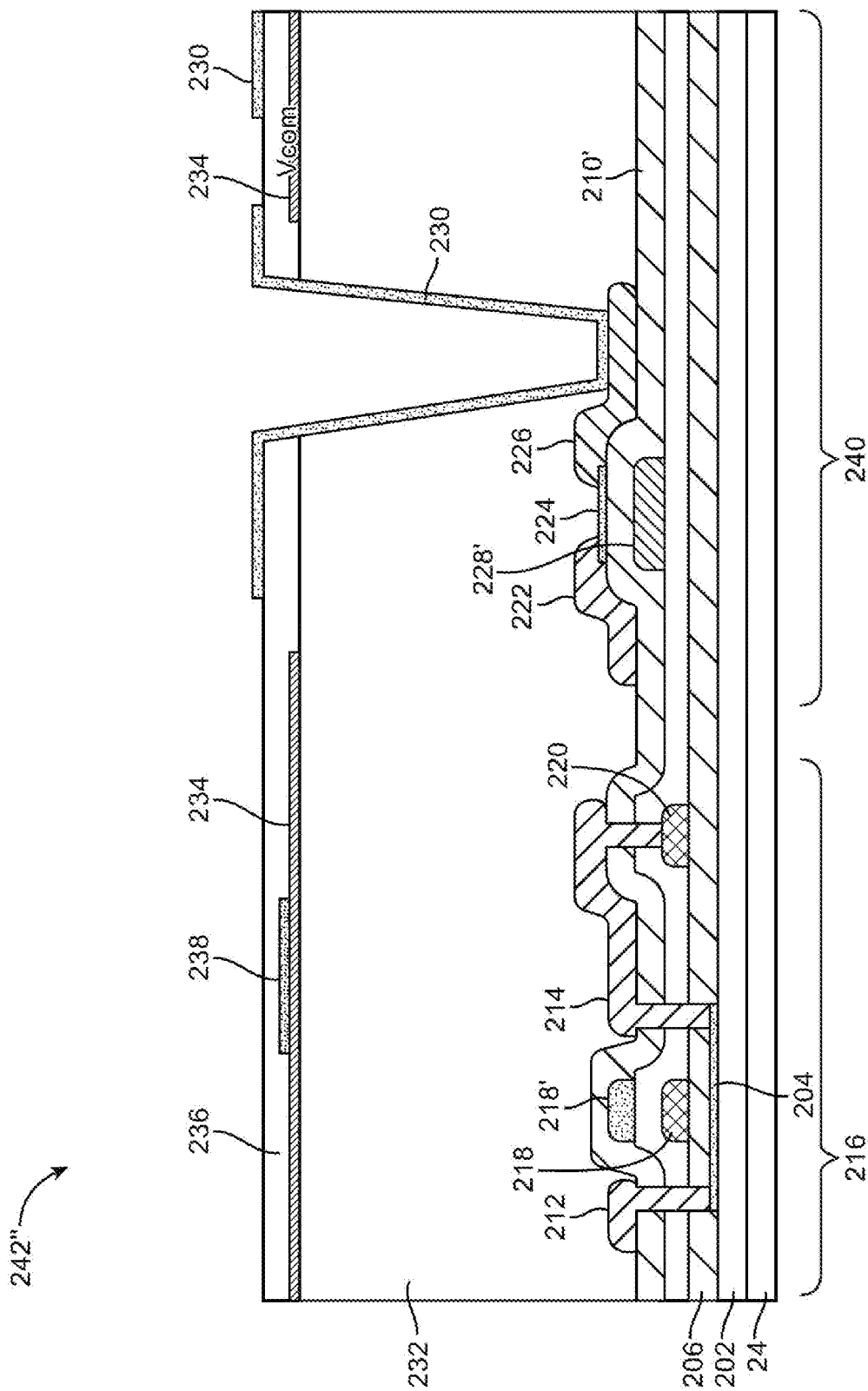

In some applications, the handling of high drive voltages (gate-to-source and drain) may need to be considered. Transistor structures 242" of FIG. 8 may be used in scenarios in which it is desired to handle relatively large (e.g., 20 volt) swings on the silicon transistor gate. In this situation, gate insulator layer 206 may be insufficiently thin to withstand damage from a 20 volt signal. For example, gate insulator 206 may be about 800 angstroms thick, which may not be sufficiently thick to reliably handle 20 volt drive voltages. To ensure that gate insulator layer 206 is not overly stressed, gate structure 218 may be converted into a floating (electrically isolated) metal structure and an additional metal layer (i.e., part of the same metal layer that is patterned to form gate 228' of oxide transistor 240) may be used in forming silicon transistor gate 218'. Floating gate 218 may be retained to serve as a mask for low density drain (LDD) implants made into the source and drain contact portions of polysilicon layer 204, even though floating gate 218 is not driven with control signals during operation of silicon transistor 216.

Figure 9:
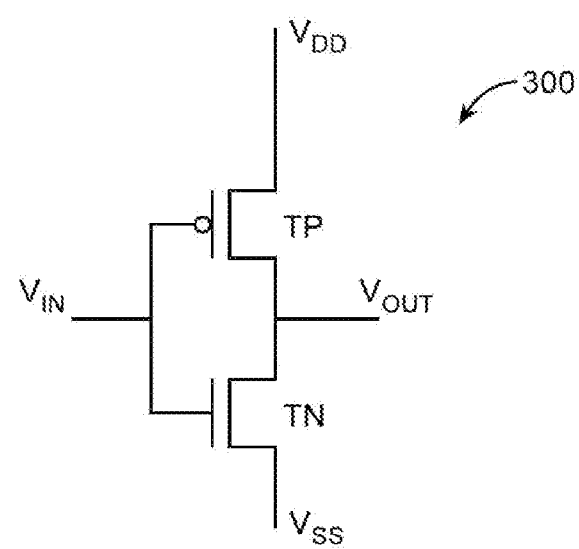
FIG. 9 is a diagram of an illustrative complementary metal-oxide-semiconductor transistor inverter of the type that may be formed from a hybrid silicon-oxide transistor structure in accordance with an embodiment.

In a hybrid silicon/oxide liquid crystal display, it is not necessary to form display driver circuitry such as gate driver circuitry 18 and demultiplexer circuitry 20 from silicon transistors. If desired, some of this display driver circuitry may be formed from oxide transistors. For example, low drive current CMOS-type circuits in the peripheral circuitry of display 14 such as illustrative CMOS inverter 300 of FIG. 9 may include oxide transistors. It may be challenging to form PMOS oxide transistors, so circuits such as inverter 300 may, if desired, be formed using an NMOS oxide transistor and a PMOS silicon transistor (as an example).

Figure 10:
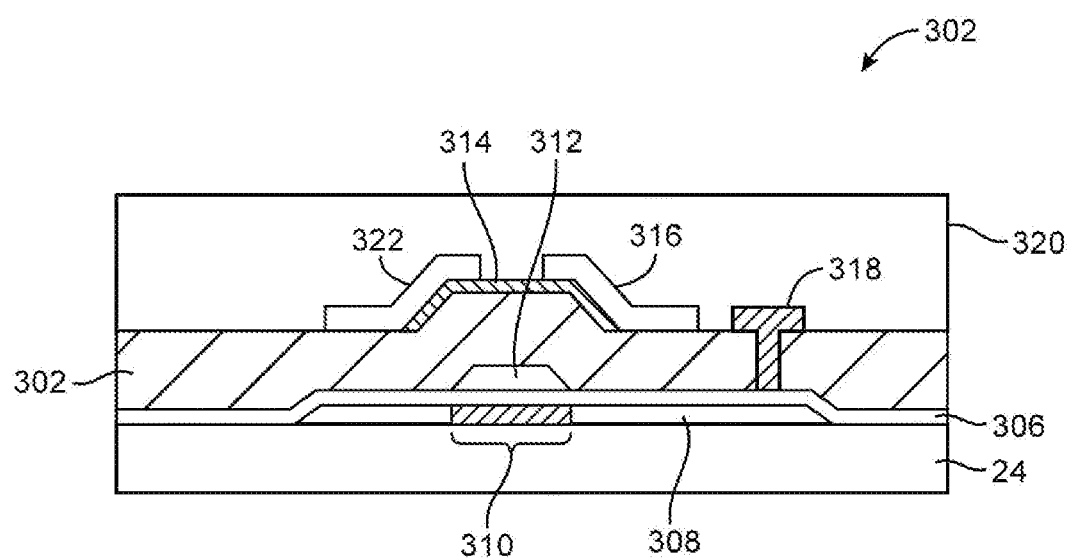
FIG. 10 is a cross-sectional side view of an illustrative thin-film transistor structure of the type that may be used to form a hybrid complementary metal-oxide-semiconductor transistor inverter in accordance with an embodiment.

Hybrid oxide-silicon thin-film transistor structures such as illustrative thin-film transistor structures 302 of FIG. 10 may be used in forming CMOS-type circuitry in display driver circuitry such as gate driver circuitry 18 and demultiplexer circuitry 20. As shown in FIG. 10, structures 302 may have a polysilicon layer 308 that is formed on substrate 24. P-channel active area 310 may be formed under gate 312. Gate insulator layer 306 (e.g., silicon oxide) may separate gate 312 from silicon channel region 310 in silicon layer 308. Dielectric layer 302 (e.g., sublayers of silicon oxide and silicon nitride) may cover gate 312. Dielectric layer 306 may separate gate 312 from overlapping oxide layer 312. Oxide layer 312 may be a semiconducting oxide such as IGZO material. Gate 312 may be formed from a first patterned metal layer. A second patterned metal layer may be used in forming output terminal 322, source terminal 316, and drain terminal 318. Passivation layer 320 may cover terminals 316 and 312. Gate 312 may be formed from materials such as molybdenum, molybdenum tungsten, tungsten, or other metals. Metal for forming structures such as metal structures 322, 316, and 318 may be formed from metal such as aluminum, molybdenum, etc.

With the arrangement of FIG. 10, gate 314 serves as a common (shared) gate for two transistors. In particular, gate 314 (see, e.g., terminal Vin of FIG. 9) serves as both a gate for a PMOS silicon transistor (transistor TP of FIG. 9) that is formed from silicon layer 308 and as a gate for an NMOS oxide transistor (transistor TN of FIG. 9) that is formed from oxide layer 312. Oxide layer 312 is located above gate 314 and silicon layer 310 is located below gate 314. The shared gate arrangement of FIG. 10 allows a CMOS inverter of the type shown in FIG. 9 to be implemented compactly.

Figure 11:
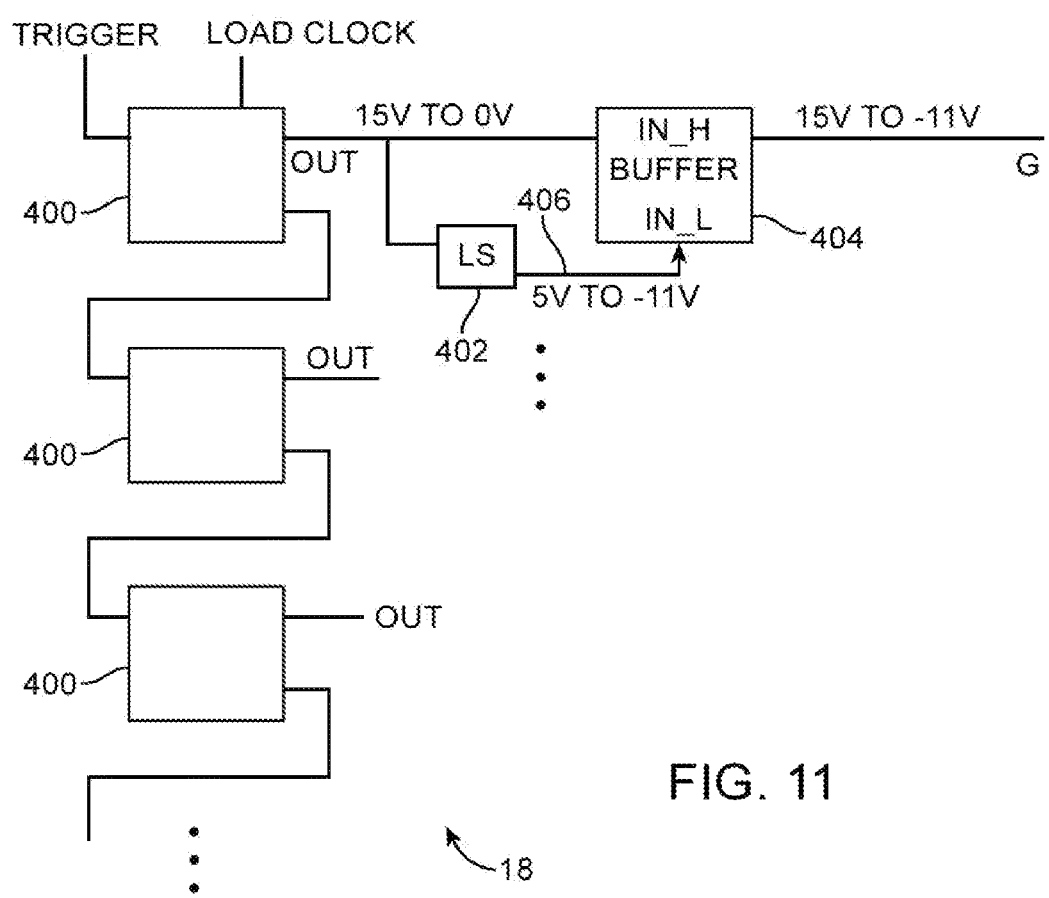
FIG. 11 is a circuit diagram of gate driver circuitry in thin-film display driver circuitry in accordance with an embodiment.

FIG. 11 shows illustrative gate driver circuitry 18 that may be used on a liquid crystal display. Circuitry 18 may use signals with a relatively small voltage swing (e.g., a 15 volt or 16 volt swing) for silicon transistors while producing gate signals G with a larger voltage swing (e.g., a 20 volt swing or more) to ensure satisfactory operation of oxide thin-film transistors in display pixels 22 that are being driven by the gate signals.

As shown in FIG. 11, circuitry 18 may have a shift register formed from a series of linked SR latches 400 or other register circuits. Each row of circuitry in FIG. 11 is associated with a separate row of display pixels 22 in a liquid crystal display and provides a respective gate signal G for that row of display pixels. During operation, trigger signal TRIGGER may be applied to the latch in the first row of the shift register in circuitry 18 while a clock signal LOAD CLOCK is being applied to the shift register. The trigger signal causes a cascading signal to ripple down through the shift register. In response, each latch 400 asserts its output OUT in sequence. Each row of gate driver circuitry 18 has a respective level shifter 402 and buffer 404 that receive output signal OUT.

Output signal OUT ranges from a high voltage of 15 V (or other suitable voltage) to 0 volts (or other suitable voltage). The 15 volt swing that is associated with this type of configuration can be tolerated by silicon thin-film transistors in latches 400, whereas larger voltage swings such as 20 volt swings might overly stress the silicon thin-film transistors. Level shifter 402 shifts the 15 volt to 0 volt signal OUT from latch 400 so that the output on path 406 from level shifter 402 ranges from 5 volts to −11 volts (i.e., a swing of 16 volts that can be tolerated by the silicon transistors in level shifter 402). Buffer 404 receives the 15 volt to 0 volt signal OUT from latch 400 as input signal IN_H and receives the 5 volt to −11 volt signal as input signal IN_L. Buffer 404 preferably contains silicon thin-film transistors. The design of buffer 404 allows buffer 404 to produce an output signal (gate line signal G) with a large voltage swing (e.g., 15 volts to −11 volts) of the type that is appropriate for controlling oxide transistors in the array of display pixels 22 on the liquid crystal display.

Figure 12:
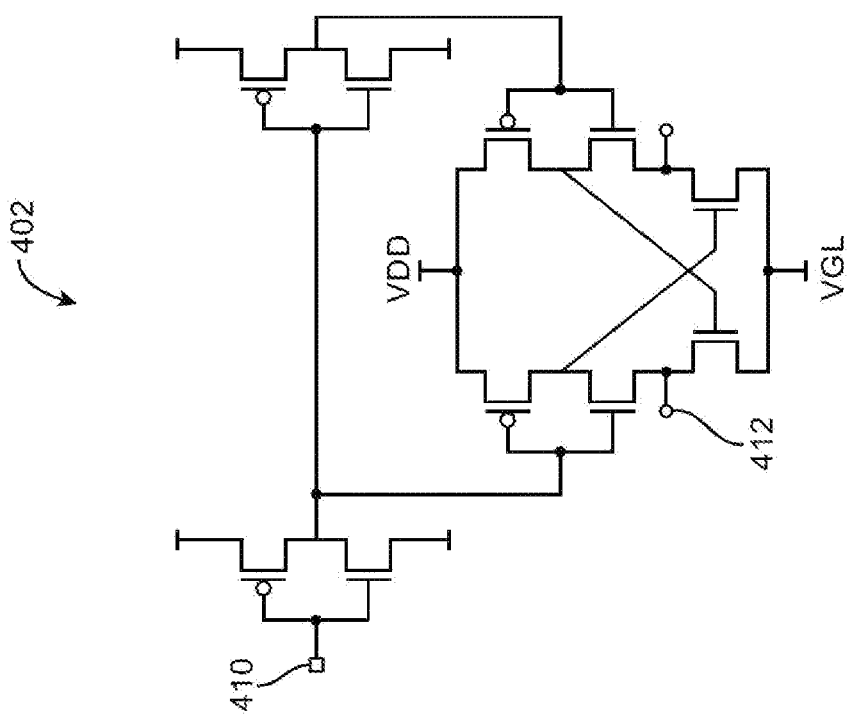
FIG. 12 is a diagram of a level shifter of the type that may be used in the gate driver circuitry of FIG. 11 within display driver circuitry on a display in accordance with an embodiment.

FIG. 12 is a circuit diagram of an illustrative circuit of the type that may be used to implement level shifter 402. Signals from output OUT of latch 400 may be received at input 410 of level shifter 402 and corresponding level-shifted output signals (signals IN_L) for buffer 404 may be provided at output 412 of level shifter 402. Other level shifter designs may be used for level shifter 402 if desired. The configuration of FIG. 12 is merely illustrative. Silicon thin-film transistors may be used in forming level shifter 402.

Figure 13:
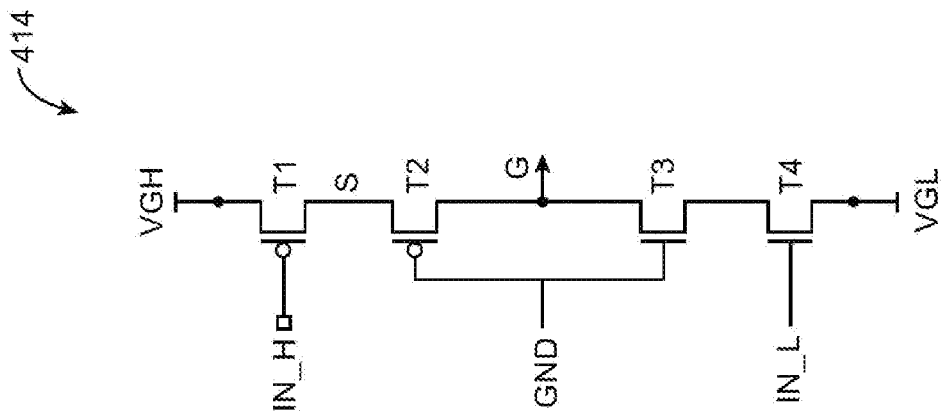
FIG. 13 is a circuit diagram of an illustrative circuit that may be used to prevent transistors within display driver circuitry on a display from experiencing excessive voltages in accordance with an embodiment.

Circuitry 404 of FIG. 13 is an example of a design that may be used in implementing buffer 404 of FIG. 11. With this design, signals IN_H and IN_L are identical square wave pulses with different respective voltage swings. Signal IN_H ranges from 15 to 0 volts. Signal IN_L ranges from 5 to −11 volts. Corresponding output signal (gate line signal) G in this example is a square wave pulse that ranges from 15 volts to −11 volts and therefore has a swing of more than 20 volts.

Ground voltage GND is applied to the gates of transistors T2 and T3. This limits that maximum voltage experienced by the transistors of circuit 414 to less than about 16 volts, even though the output swing of circuit 414 is more than 20 volts. The ground voltage GND on the gates of transistors T2 and T3 causes these transistors to turn off to protect transistors T1 and T4 whenever excessive source terminal voltage swing is detected. Consider, as an example, transistors T1 and T2. Transistor T2 may be characterized by a threshold voltage Vth. If the source S of transistor T1 starts to fall below voltage GND−Vth, transistor T2 will turn off and isolate transistor T1. Transistors T3 and T4 operate in the same way. Using this arrangement, none of the transistors in buffer 414 is exposed to excessive voltage swings, allowing transistors T1, T2, T3, and T4 to be formed from silicon thin-film transistors.

If desired, other circuit configurations may be used to allow gate driver circuitry 18 to operate in an environment in which gate line signal G has a large voltage swing to accommodate oxide transistors in display pixels 22. As an example, a subset of the level shifter transistors and a subset of the output buffer transistors may be implemented using oxide thin-film transistor structures in addition to using silicon thin-film transistor structures.

Figure 14:
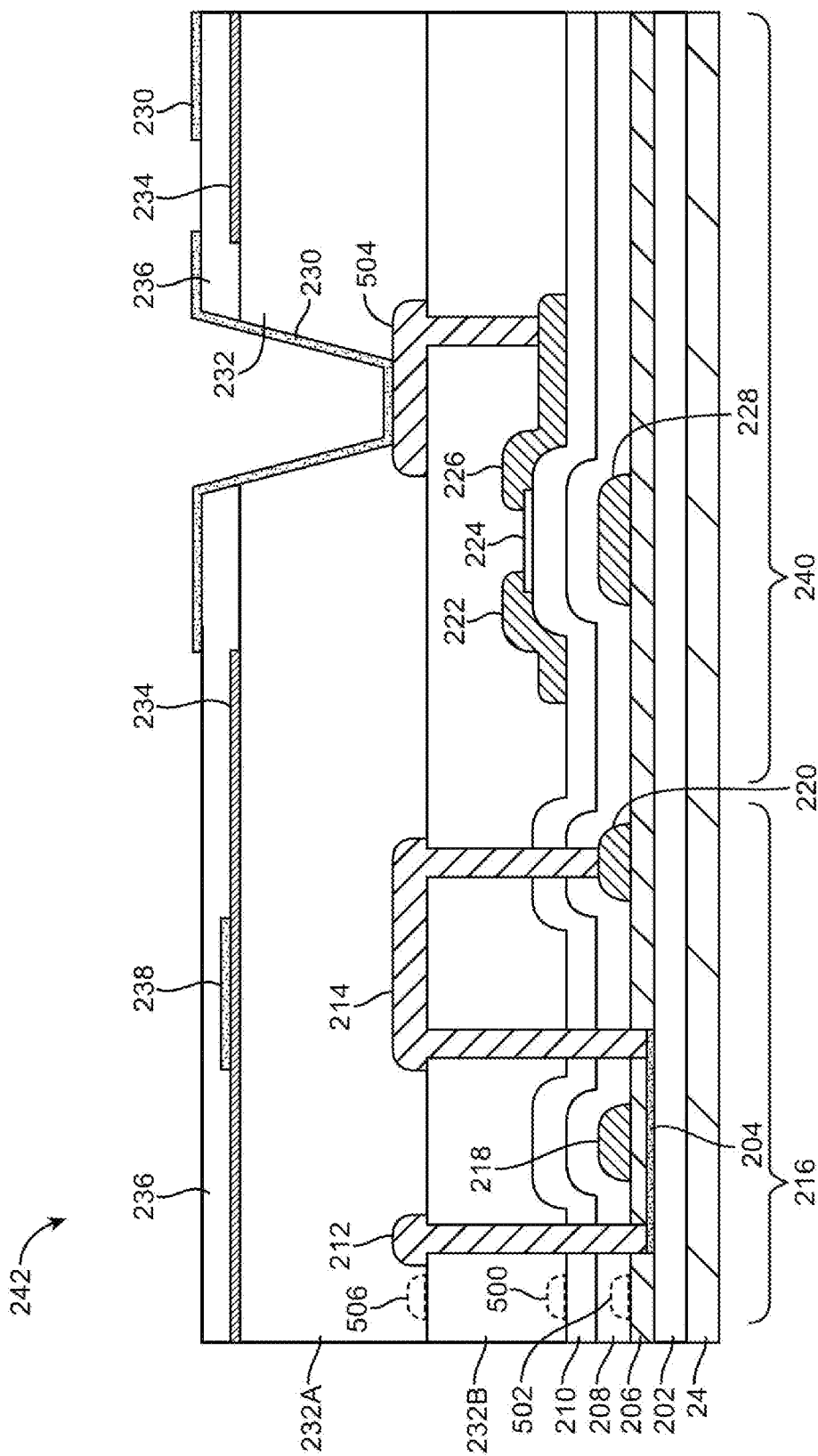
FIG. 14 is a cross-sectional side view of illustrative thin-film transistor circuitry in a liquid crystal display in accordance with an embodiment.

FIG. 14 is a cross-sectional side view of additional thin-film transistor circuitry of the type that may be used in a liquid crystal display. As shown in FIG. 14, thin-film transistor structures 242 may include silicon thin-film transistor structures 216 (e.g., for forming parts of peripheral circuits such as display driver circuitry 18 and demultiplexer circuitry 20) and oxide thin-film transistor structures 240 (e.g., for forming display pixels 22 in a liquid crystal display having a layout of the type shown by display 14 of FIG. 1).

Structures 216 and 240 may be formed on buffer layer 202 on substrate 24. Polysilicon layer 204 may be deposited on buffer 202. Gate insulator layer 206 may be formed on polysilicon layer 204. A common layer of metal may be patterned to form metal structures 218, 220, and 228. Structure 218 may serve as the gate for a silicon transistor that includes source-drain contacts 212 and 214 and a channel formed from polysilicon 204. Metal structure 228 may serve as a gate for an oxide transistor formed from semiconducting oxide layer 224 (e.g., IGZO) and source-drain terminals 222 and 226. Metal structure 228 may also serve as a light shield that helps block backlight in display 14 from reaching oxide layer 224, so no separate light shielding structures need be incorporated in structures 240. Interlayer dielectric such as silicon nitride layer 208 and 210 may cover gate 218 in structure 216 and may serve as a gate insulator for gate 228 in the oxide transistor of structures 240.

Metal structures 218, 220, and 228 and routing lines such as interconnect line 502 may be formed from a first metal layer (sometimes referred to as an M1 layer). Metal 222 and 226, which form source-drain contacts for the oxide transistor of structures 240, and routing lines such as interconnect line 500 may be formed from a second metal layer (sometimes referred to as an SD1 layer). Metal structures 212, 214, and routing lines such as interconnect line 506 may be formed from a third metal layer (sometimes referred to as an SD2 layer). Dielectric layers 232B may separate the second metal layer from the third metal layer. Dielectric layer 232A may separate the third metal layer from metal structures such as metal layer 234.

Metal 230 contacts metal layer 504 and is thereby coupled to source-drain 226 of the display pixel thin-film oxide transistor that is formed from oxide layer 224. Metal 230 may be supported by organic layer 232B. On the surface of organic layer 232B, metal 230 may form an electrode with multiple fingers. Dielectric layer 236 may isolate electrode 230 from common electrode (Vcom) 234. During operation, electric fields are produced between electrode 230 and electrode 234. These fields pass through the liquid crystal material in the display. If desired, display 14 may incorporate capacitive touch sensors that are formed from portions of Vcom electrode 234. In this type of configuration, optional metal lines such as line 238 may be used to help reduce the resistance of the material used in forming electrode 234 (which may be, for example, a somewhat resistive conducting material such as indium tin oxide).

Capacitive coupling between the routing lines in display 14 can lead to switching losses. As an example, source-drain structure 222 may be coupled to the data line in display 14. The voltage on this line switches relative to Vcom (electrode 234) and can lead to power losses. The presence of dielectric layers 232A and 232B can help reduce capacitive coupling between the data line and Vcom electrode and thereby reduce power losses. The presence of these dielectric layers can also reduce capacitive coupling between routing lines in display 14 (e.g., capacitive coupling between routing lines and other structures of the first and second metal layers, the first and third metal layers, etc.). Layers 232A and 232B may be formed from low-dielectric-constant organic dielectric or other dielectric material. As an example, layers 232A and 232B may be acrylic polymers, other polymers, dielectrics of the type sometimes referred to as spin-on-glass, (e.g., spin-on-glass polymers deposited via slit coating tools, etc.), siloxane-based materials, etc.

Figure 15:
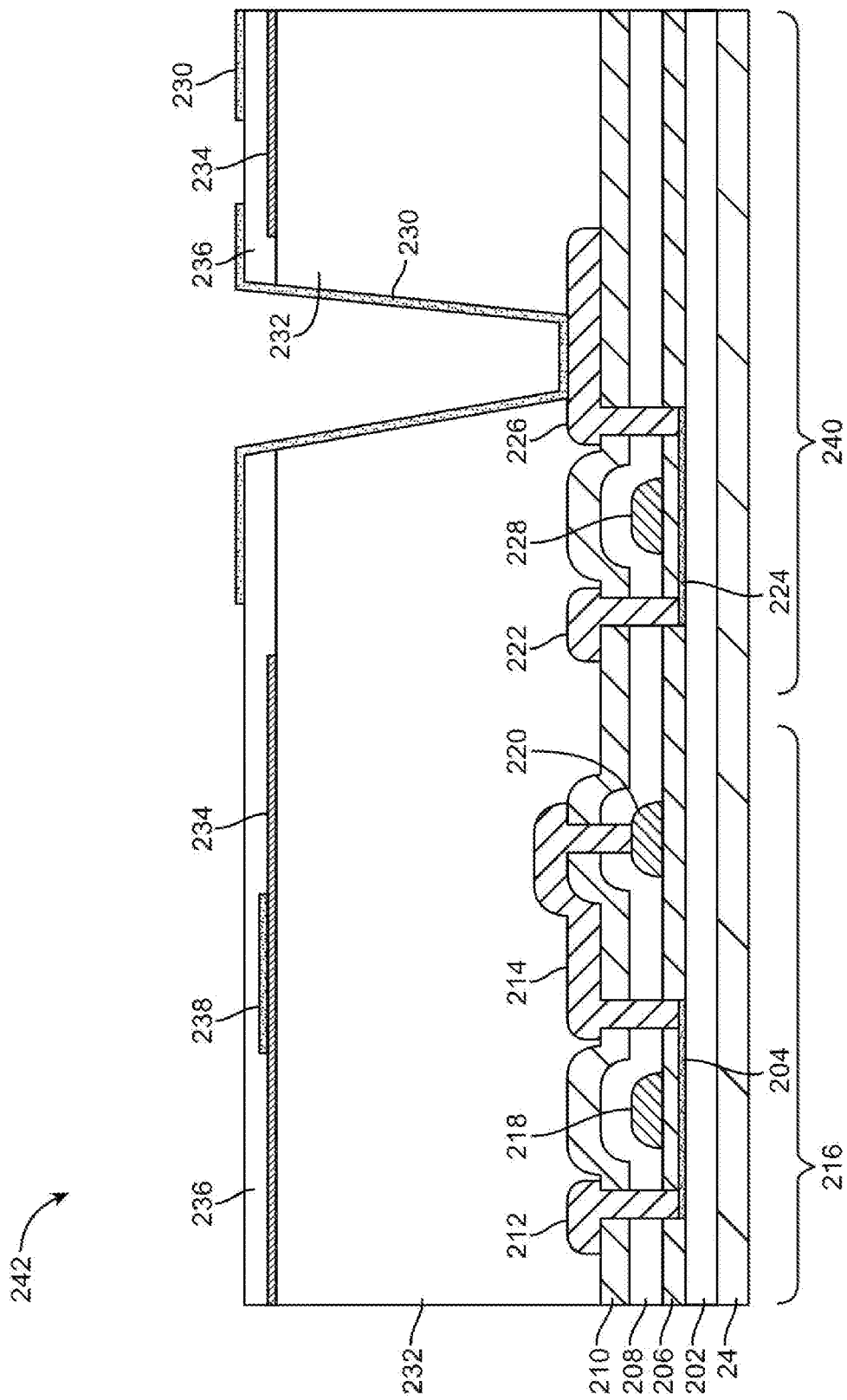
FIG. 15 is a cross-sectional side view of illustrative thin-film transistor circuitry that includes a top gate semiconducting oxide transistor in a liquid crystal display in accordance with an embodiment.

FIG. 15 is a cross-sectional side view of illustrative thin-film transistor circuitry for a liquid crystal display that includes a top gate semiconducting oxide transistor. As shown in FIG. 15, thin-film transistor structures 242 may include silicon thin-film transistor structures 216 and semiconducting oxide thin-film transistor structures 240. Silicon thin-film transistor structures 216 may be used in peripheral circuits such as display driver circuitry 18 and demultiplexer circuitry 20 and/or may be used in forming circuits for display pixels 22 in a liquid crystal display. Semiconducting oxide thin-film transistor structures 240 may be used in peripheral circuits such as display driver circuitry 18 and demultiplexer circuitry 20 and/or may be used in forming circuits for display pixels 22 in a liquid crystal display. Transistors such as silicon (polysilicon) transistor 216 may be n-channel or p-channel devices. Transistors such as semiconducting oxide transistor 240 may be n-channel or p-channel devices.

Structures 216 and 240 may be formed on buffer layer 202 on substrate 24. Buffer layer 202 may be formed from a dielectric such as an inorganic dielectric. Buffer layer 202 may help prevent ions in substrate 24 from migrating into structures 216 and 240.

Polysilicon layer 204 may be deposited on buffer 202. Gate insulator layer 206 may be formed on polysilicon layer 204. Gate insulator layer 206 may be formed from a dielectric such as silicon oxide (e.g., a 100 nm silicon oxide layer). A common layer of metal may be patterned to form metal structures 218, 220, and 228. Structure 218 may serve as the gate for a silicon transistor that includes source-drain contacts 212 and 214 and a channel formed from polysilicon 204. Metal structure 228 may serve as a gate for a top gate oxide transistor (i.e., a semiconducting oxide transistor) formed from semiconducting oxide layer 224 (e.g., IGZO) and source-drain terminals 222 and 226. One or more layers of interlayer dielectric (ILD) may cover metal structures 218, 220, and 228. For example, a first dielectric layer such as layer 208 and a second dielectric layer such as layer 210 may cover metal structures 218, 220, and 228. Layer 208 may be a silicon nitride layer and layer 210 may be a silicon oxide layer (as examples). Because there is no lateral overlap between gate 228 and source-drain electrodes 222 and 226, parasitic capacitance between gate 228 and source-drain structures 222 and 226 may be minimized. Moreover, layers 208 and 210 of the oxide transistor of FIG. 15 may be thicker than layers 208 and 210 in bottom-gate oxide transistor of FIG. 14, thereby further reducing parasitic capacitances.

Metal structures 218, 220, and 228 may be formed from a first metal layer (sometimes referred to as an M1 layer). Metal 222 and 226, which form source-drain contacts for the oxide transistor of structures 240 and metal 212 and 214, which form source-drain contacts for the silicon transistor of structures 216 may be formed from a second metal layer (sometimes referred to as an SD1 layer or M2 layer). Metal structures such as metal line 238 may be formed from a third metal layer (sometimes referred to as an M3 layer). Dielectric 232 (e.g., an organic dielectric layer such as a polymer layer) may separate the second metal layer from the third metal layer.

Metal 230 contacts source-drain 226 of the display pixel thin-film oxide transistor that is formed from oxide layer 224. Metal 230 may be supported by organic layer 232. On the surface of organic layer 232, metal 230 may form an electrode with multiple fingers (e.g., a pixel electrode for a display pixel in the display). Dielectric layer 236 may isolate electrode 230 from common electrode (Vcom) 234. During operation, electric fields are produced between electrode 230 and electrode 234. These fields pass through the liquid crystal material in the display that is formed on top of the structures of FIG. 15. If desired, display 14 may incorporate capacitive touch sensors that are formed from portions of Vcom electrode 234. In this type of configuration, optional metal lines such as line 238 may be used to help reduce the resistance of the material used in forming electrode 234 (which may be, for example, a somewhat resistive conducting material such as indium tin oxide).

Figure 16:
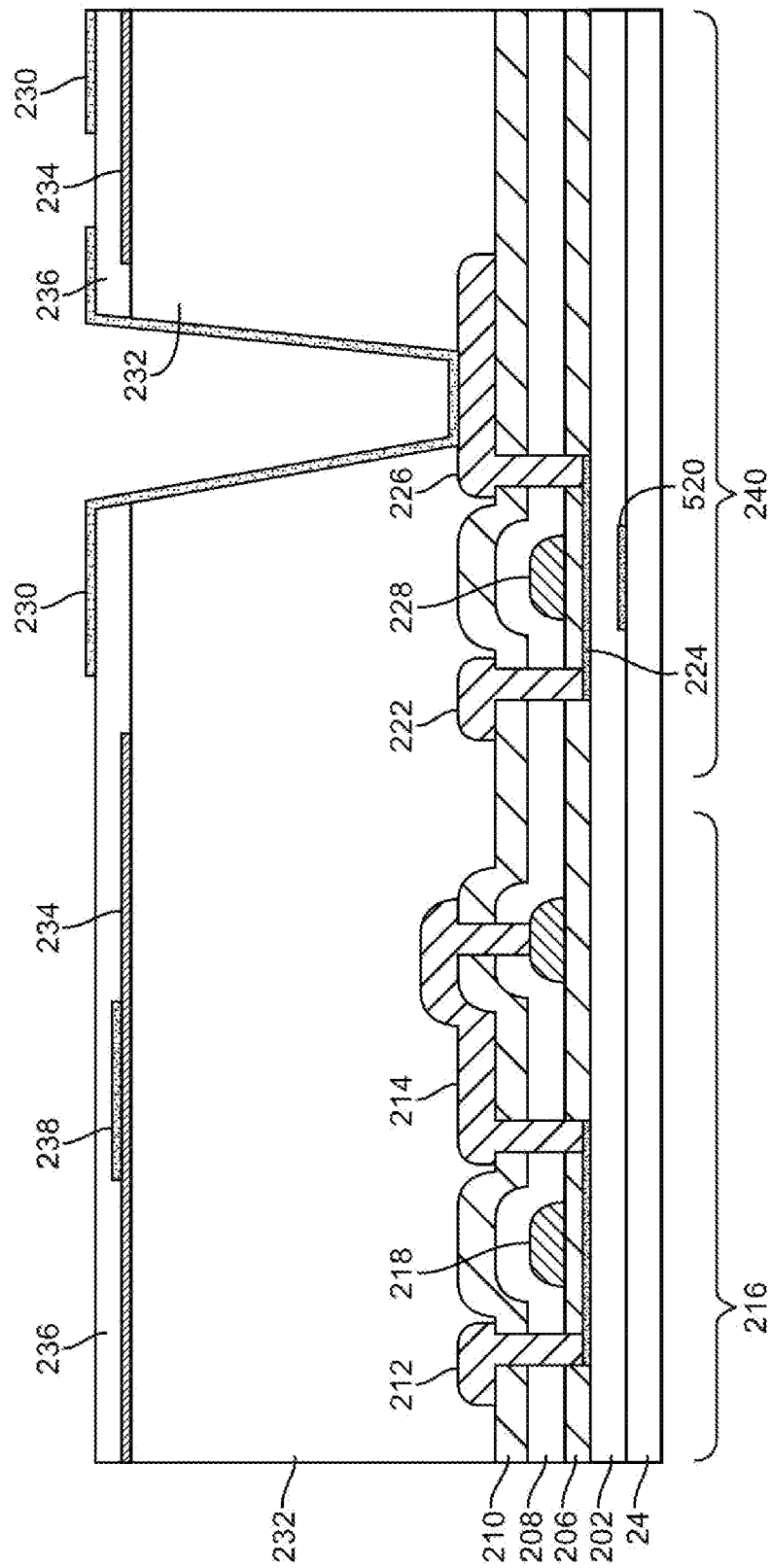
FIG. 16 is a cross-sectional side view of illustrative thin-film transistor circuitry that includes a top gate semiconducting oxide transistor with a light shield in a liquid crystal display in accordance with an embodiment.

As shown in FIG. 16, an optional light shielding structure such as light shield 520 can be formed under semiconducting-oxide transistor 240 or elsewhere in the display. Light shield 520 may be formed from an opaque material such as a metal, an oxidized metal, a dark polymer, or other light blocking materials. The presence of light shield 520 can help prevent stray light from disrupting the operation of semiconducting oxide transistor structures 240 or other overlapping structures.

Figure 17:
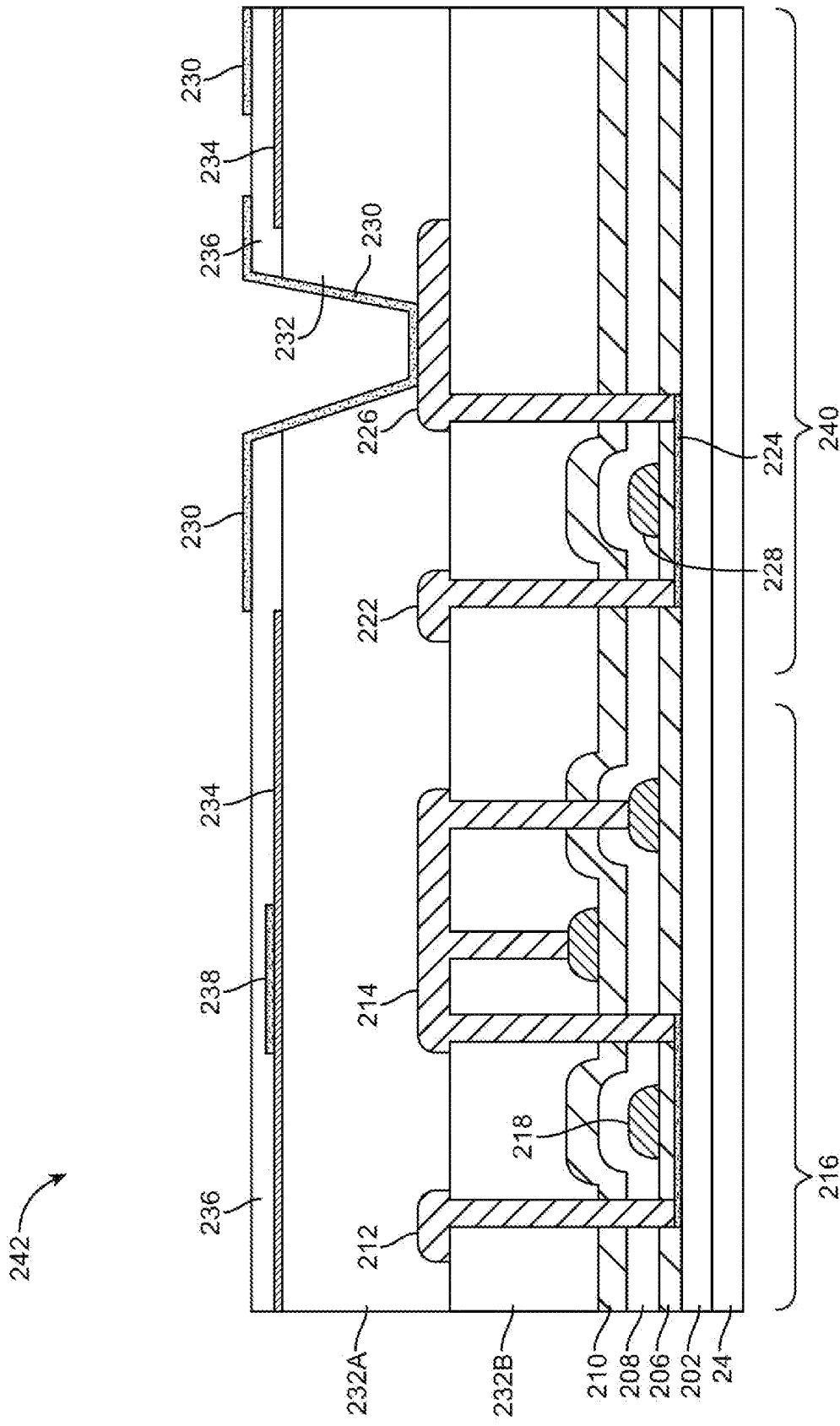
FIG. 17 is a cross-sectional side view of illustrative thin-film transistor circuitry that includes a top gate semiconducting oxide transistor in a liquid crystal display in accordance with an embodiment.
Figure 18:
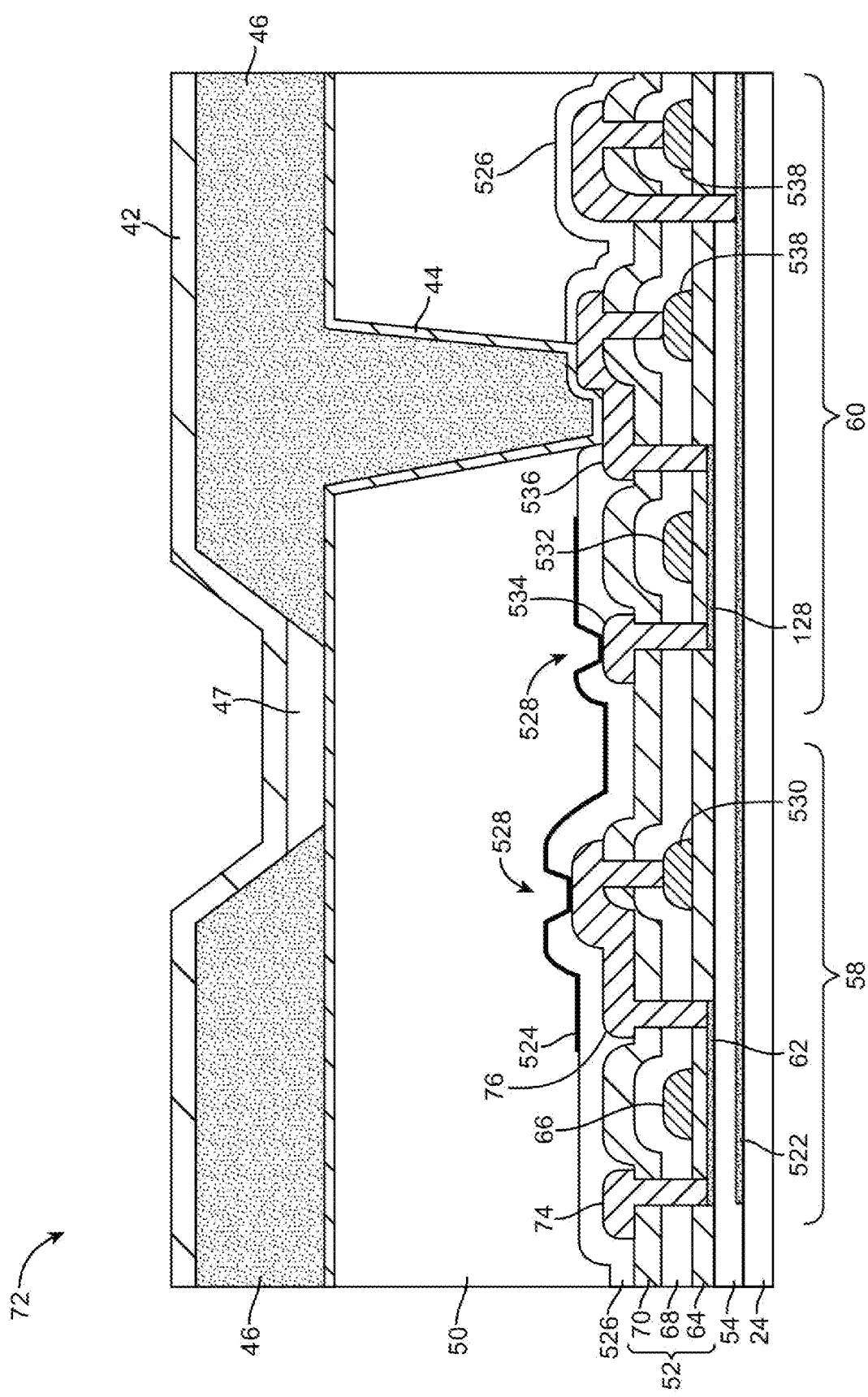
FIG. 18 is a cross-sectional side view of illustrative thin-film transistor circuitry that includes a top gate semiconducting oxide transistor in an organic light-emitting diode display in accordance with an embodiment.

In the example of FIG. 17, dielectric layer 232 of FIG. 15 has been divided into two dielectric layers 232A and 232B. Layer 232A may overlap the source-drain electrodes of transistors 216 and 240. Layer 232B may be interposed between the source-drain electrodes and other metal structures formed form the source-drain metal layer and layers 208 and 210. As described in connection with FIG. 14, this type of two-layer approach can reduce capacitive coupling between the metal structures of devices 216 and 240. A cross-sectional side view of illustrative thin-film transistor circuitry that includes a top gate semiconducting oxide transistor in an organic light-emitting diode display is shown in FIG. 18. As shown in FIG. 18, circuitry 72 may include display pixel structures such as light-emitting diode cathode terminal 42 and light-emitting diode anode terminal 44. Organic light-emitting diode emissive material 47 may be interposed between cathode 42 and anode 44. Pixel definition layer 46 may be a dielectric layer 46 that serves to define the layout of the display pixel. Layer 46 may be formed from a polymer such as a black polymer to help block stray light.

Planarization layer 50 may be formed on top of thin-film transistor structures 52. Thin-film transistor structures 52 may be formed on buffer layer 54 on substrate 24. Substrate 24 may be formed from metal, glass, polymer, other materials, or combinations of these materials. Buffer layer 54 may be formed from an inorganic dielectric layer that helps prevent ions in substrate 24 from disrupting the operation of structures 52. Optional functional layer 522 may be interposed between buffer layer 54 and substrate 24. Functional layer 522 may be a stress relief layer, a light-blocking layer, a layer used in forming components such as capacitors (e.g., capacitor electrodes for pixel circuits and/or peripheral circuits), etc.

Thin-film transistor structures 52 may include silicon transistor 58. Transistor 58 may be an LTPS transistor formed using a top gate design and may serve as a switching transistor in an organic light-emitting diode display pixel (see, e.g., transistor 30 in pixel 22-1 of FIG. 2). Transistor 58 may also be used in peripheral circuits (e.g., driver circuitry 18 and demultiplexer circuitry 20).

Transistor 58 may have a polysilicon channel 62 that is covered by gate insulator layer 64 (e.g., a layer of silicon oxide having a thickness of 100 nm or other suitable thickness). Gate 66 may be formed from patterned metal (e.g., molybdenum, as an example). Gate 66 may be covered by a layer of interlayer dielectric (e.g., silicon nitride layer 68 and silicon oxide layer 70). Source-drain contacts 74 and 76 may contact opposing sides of polysilicon layer 62 to form silicon thin-film transistor 58.

Dielectric layer 526 may cover source-drain structures 74 and 76. Optional metal layer 524 may be formed on layer 526 and may, if desired, contact underlying metal structures though vias (see, e.g., vias 528). Structure 66 may be formed in a first ("M1") metal layer. Source-drain electrodes 74 and 76 may be formed in a second metal layer. Metal layer 524 may be formed as part of a third ("M3") metal layer. Layer 524 may overlap portions of transistor 58 and/or transistor 60 and may be used for forming capacitors or signal interconnect lines (i.e., routing). Layer 524 may be overlapped by emissive material layer 47 and may form a light-blocking structures that prevent stray light from emissive material 47 from reaching underlying transistor structures, etc.

Thin-film transistor structures such as semiconducting-oxide thin-film transistor structures 60 and silicon thin-film transistor structures 58 may be used in forming part of a pixel circuit in an organic light-emitting diode display and/or may be used in forming part of peripheral circuitry 18 and 20. Thin-film transistor 60 of FIG. 18 may be a top gate semiconducting-oxide transistor. The gate insulator layer 64, which serves as the gate insulator for silicon transistor 58, also serves as the gate insulator for oxide transistor 60.

Metal gate 532 forms the gate of oxide transistor 60. The channel semiconductor of the oxide transistor may be formed from semiconducting oxide layer 128 (e.g., IGZO). Source-drain terminals 534 and 536 may be formed from metal contacting opposing ends of semiconducting oxide layer 128. Metal structures 530 and 538 may be used for routing and may be formed from the same layer of metal that is patterned to form gates 66 and 532. Structures such as source-drain structures 534 and 536 may be formed from the same layer of metal that is used in forming source-drain structures 74 and 76.

The foregoing is merely illustrative and various modifications can be made by those skilled in the art without departing from the scope and spirit of the described embodiments. The foregoing embodiments may be implemented individually or in any combination.

What is claimed is:
1. An electronic device comprising a display with a display pixel, wherein the display pixel comprises:
   a light-emitting diode;

a plurality of transistors that is configured to control an amount of light emitted by the light-emitting diode, wherein the plurality of transistors includes a semiconducting oxide thin-film transistor having a first gate and a silicon thin-film transistor having a second gate;

a capacitor coupled to at least one of the plurality of transistors, wherein the capacitor has first and second electrode layers;

a layer of metal that is patterned to form the second gate and the first electrode layer;

a first dielectric layer formed over the layer of metal; and a second dielectric layer formed over the first dielectric layer.

2. The electronic device defined in claim 1, wherein the silicon thin-film transistor has a polysilicon channel and is coupled to the capacitor.

3. The electronic device defined in claim 1, wherein the first gate is formed from another portion of the layer of metal.

4. The electronic device defined in claim 1, wherein the semiconducting oxide thin-film transistor has a semiconducting oxide channel region and is coupled to the light-emitting diode.

5. The electronic device defined in claim 1, wherein the capacitor is a storage capacitor configured to store data associated with a frame.

6. The electronic device defined in claim 1, wherein an additional layer of metal is interposed between the first and second dielectric layers.

7. The electronic device defined in claim 1, wherein the first dielectric layer is silicon oxide.

8. The electronic device defined in claim 1, wherein the first dielectric layer is silicon nitride.

9. An electronic device comprising a display with a display pixel, wherein the display pixel comprises:

a light-emitting diode;

a plurality of transistors that is configured to control an amount of light emitted by the light-emitting diode, wherein the plurality of transistors includes a semiconducting oxide thin-film transistor having a first gate and a silicon thin-film transistor having a second gate;

a capacitor coupled to at least one of the plurality of transistors, wherein the capacitor has first and second electrode layers; and a layer of metal that is patterned to form the second gate and the first electrode layer, wherein the semiconducting oxide thin-film transistor comprises a layer of semiconducting oxide and wherein the first gate and the layer of semiconducting oxide are overlapping.

10. The electronic device defined in claim 9, wherein the first gate comprises molybdenum.

11. The electronic device defined in claim 9, wherein the first gate comprises molybdenum and a metal that is different from molybdenum.

12. The electronic device defined in claim 9, wherein the first gate comprises molybdenum and a refractory metal that is different from molybdenum.

13. The electronic device defined in claim 12, wherein the refractory metal that is different from molybdenum comprises tungsten.

14. A display pixel comprising:

a light-emitting diode;

a plurality of transistors that is configured to control an amount of light emitted by the light-emitting diode, wherein the plurality of transistors includes a semiconducting oxide thin-film transistor having a first gate and a silicon thin-film transistor having a second gate;

a capacitor coupled to at least one of the plurality of transistors, wherein the capacitor has first and second electrode layers; and a layer of metal that is patterned to form the second gate and the first electrode layer, wherein the semiconducting oxide thin-film transistor comprises a layer of semiconducting oxide and wherein the first gate and the layer of semiconducting oxide are overlapping.

* * * * *